United States Patent
Shinkawata

(10) Patent No.: US 10,790,355 B2
(45) Date of Patent: Sep. 29, 2020

(54) SEMICONDUCTOR DEVICE AND MANUFACTURING METHOD THEREOF

(71) Applicant: Renesas Electronics Corporation, Tokyo (JP)

(72) Inventor: Hiroki Shinkawata, Tokyo (JP)

(73) Assignee: Renesas Electronics Corporation, Koutou-ku, Tokyo (JP)

(*) Notice: Subject to any disclaimer, the term of this patent is extended or adjusted under 35 U.S.C. 154(b) by 158 days.

(21) Appl. No.: 15/631,257

(22) Filed: Jun. 23, 2017

(65) Prior Publication Data
US 2017/0373145 A1 Dec. 28, 2017

(30) Foreign Application Priority Data
Jun. 28, 2016 (JP) .................................. 2016-127930

(51) Int. Cl.
H01L 21/762 (2006.01)
H01L 29/06 (2006.01)
H01L 29/66 (2006.01)
H01L 29/786 (2006.01)
(Continued)

(52) U.S. Cl.
CPC .... *H01L 29/0653* (2013.01); *H01L 21/76283* (2013.01); *H01L 29/6653* (2013.01); *H01L 29/66477* (2013.01); *H01L 29/66492* (2013.01); *H01L 29/66628* (2013.01); *H01L 29/66772* (2013.01); *H01L 29/78* (2013.01); *H01L 29/78606* (2013.01); *H01L 29/78654* (2013.01);
(Continued)

(58) Field of Classification Search
None
See application file for complete search history.

(56) References Cited

U.S. PATENT DOCUMENTS 6,187,651 B1 * 2/2001 Oh .................... H01L 21/76232
438/435
6,265,743 B1 7/2001 Sakai et al.
6,372,604 B1 4/2002 Sakai et al.
(Continued)

FOREIGN PATENT DOCUMENTS

JP 10-340950 A 12/1998
JP 2004-214628 A 7/2004
JP 2014-143269 A 8/2014

OTHER PUBLICATIONS

Communication dated Aug. 13, 2019, issued by the Japan Patent Office in corresponding Japanese Application No. 2016-127930.

*Primary Examiner* — Joseph C. Nicely
*Assistant Examiner* — Lamont B Koo
(74) *Attorney, Agent, or Firm* — Sughrue Mion, PLLC

(57) ABSTRACT

In an SOI substrate having a semiconductor substrate serving as a support substrate, an insulating layer on the semiconductor substrate and a semiconductor layer on the insulating layer, an element isolation region which penetrates the semiconductor layer and the insulating layer and whose bottom part reaches the semiconductor substrate is formed, and a gate electrode is formed on the semiconductor layer via a gate insulating film. A divot is formed in the element isolation region at a position adjacent to the semiconductor layer, and a buried insulating film is formed in the divot. The gate electrode includes a part formed on the semiconductor layer via the gate insulating film, a part located on the buried insulating film and a part located on the element isolation region.

16 Claims, 35 Drawing Sheets

(51) Int. Cl.
*H01L 29/78* (2006.01)
*H01L 21/265* (2006.01)

(52) U.S. Cl.
CPC ........ *H01L 21/2652* (2013.01); *H01L 29/665* (2013.01)

(56) References Cited

U.S. PATENT DOCUMENTS

| | | | |
|---|---|---|---|
| 6,905,941 B2* | 6/2005 | Doris | H01L 21/76283 257/E21.703 |
| 2004/0129979 A1 | 7/2004 | Park et al. | |
| 2005/0040465 A1 | 2/2005 | Park et al. | |
| 2011/0115021 A1* | 5/2011 | Dennard | H01L 21/76232 257/347 |
| 2012/0235245 A1 | 9/2012 | Pal et al. | |
| 2013/0049161 A1 | 2/2013 | Piper et al. | |

* cited by examiner

SEMICONDUCTOR DEVICE AND MANUFACTURING METHOD THEREOF

CROSS-REFERENCE TO RELATED APPLICATION

The present application claims priority from Japanese Patent Application No. 2016-127930 filed on Jun. 28, 2016, the content of which is hereby incorporated by reference into this application.

TECHNICAL FIELD OF THE INVENTION

The present invention relates to a semiconductor device and a manufacturing method of the semiconductor device, and can be effectively utilized for, for example, a semiconductor device using an SOI (Silicon On Insulator) substrate and a manufacturing method of the semiconductor device.

BACKGROUND OF THE INVENTION

In the manufacture of a semiconductor device, an element isolation region is first formed in a semiconductor substrate, a semiconductor element such as MISFET (Metal Insulator Semiconductor Field Effect Transistor) is formed in an active region of the semiconductor substrate defined by the element isolation region, and a multilayer wiring structure is formed on the semiconductor substrate. In addition, a technique using an SOI substrate as the semiconductor substrate has been known.

Japanese Patent Application Laid-Open No. H10-340950 (Patent Document 1) describes a technique related to a trench element isolation structure. Japanese Patent Application Laid-Open No. 2004-214628 (Patent Document 2) describes a technique related to a semiconductor device using an SOI wafer.

SUMMARY OF THE INVENTION

It is desired that the reliability is improved in a semiconductor device manufactured using an SOI substrate.

The other problems and novel characteristics will be apparent from the description of the present specification and the accompanying drawings.

According to an embodiment, a semiconductor device includes: a substrate having a support substrate, an insulating layer on the support substrate and a semiconductor layer on the insulating layer; an element isolation region which penetrates the semiconductor layer and the insulating layer, and whose bottom part reaches the support substrate; and a gate electrode formed on the semiconductor layer via a gate insulating film. A hollow part is formed in the element isolation region at a position adjacent to the semiconductor layer, a buried insulating film is formed in the hollow part, and the gate electrode includes a part formed on the semiconductor layer via the gate insulating film, a part located on the buried insulating film and a part located on the element isolation region.

In addition, according to an embodiment, a manufacturing method of a semiconductor device includes the step of (a) preparing a substrate having a semiconductor substrate, an insulating layer on the semiconductor substrate, a semiconductor layer on the insulating layer, a first insulating film on the semiconductor layer, a trench penetrating the first insulating film, the semiconductor layer and the insulating layer to reach the semiconductor substrate, and an element isolation region buried in the trench. The manufacturing method of a semiconductor device further includes the steps of: (b) after the step (a), removing the first insulating film by etching, thereby exposing the semiconductor layer; (c) after the step (b), forming a gate insulating film on a surface of the semiconductor layer; and (d) after the step (c), forming a gate electrode on the semiconductor layer via the gate insulating film. The step (c) is performed in a state where a hollow part is formed in the element isolation region at a position adjacent to the semiconductor layer and a buried insulating film is formed inside the hollow part. The manufacturing method of a semiconductor device further includes, after the step (b) and before the step (c), the steps of: (c1) forming a second insulating film for forming the buried insulating film on the element isolation region and the semiconductor layer including the inside of the hollow part; and (c2) removing the second insulating film outside the hollow part so as to leave the second insulating film in the hollow part, thereby forming the buried insulating film.

According to an embodiment, it is possible to improve the reliability of the semiconductor device.

BRIEF DESCRIPTIONS OF THE DRAWINGS

DESCRIPTIONS OF THE PREFERRED EMBODIMENTS

Figure 1:
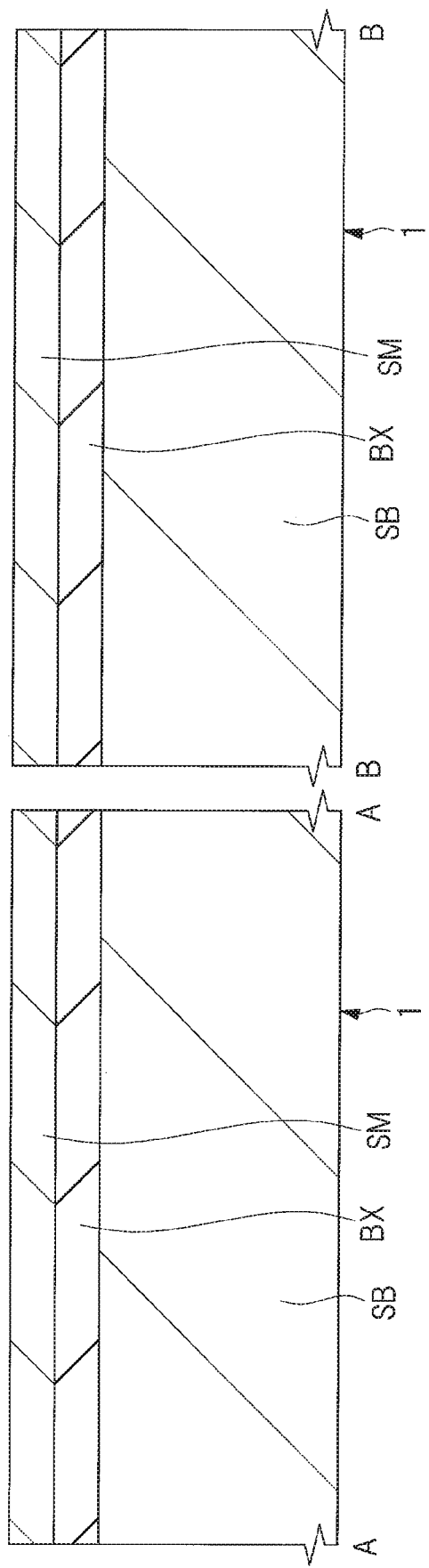
FIG. 1 is a cross-sectional view showing a principal part of a semiconductor device in a manufacturing process according to an embodiment.

In the embodiments described below, the invention will be described in a plurality of sections or embodiments when required as a matter of convenience. However, these sections or embodiments are not irrelevant to each other unless otherwise stated, and the one relates to the entire or apart of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments will be described in detail based on drawings. Note that components having the same function are denoted by the same reference characters throughout the drawings for describing the embodiments, and the repetitive description thereof will be omitted. In addition, the description of the same or similar portions is not repeated in principle unless particularly required in the following embodiments.

Also, in some drawings used in the following embodiments, hatching is omitted even in a cross-sectional view so as to make the drawings easy to see. In addition, hatching is used even in a plan view so as to make the drawings easy to see.

First Embodiment

<Manufacturing Process of Semiconductor Device>

A manufacturing process of a semiconductor device according to the present embodiment will be described with reference to drawings. FIG. 1 to FIG. 24 are cross-sectional views and plan views each showing a principal part of the semiconductor device in the manufacturing process according to one embodiment of the present invention. Note that of FIG. 1 to FIG. 24, FIG. 11 and FIG. 15 are plan views each showing a principal part of the semiconductor device, and FIG. 1 to FIG. 10, FIG. 12 to FIG. 14 and FIG. 16 to FIG. 24 are cross-sectional views each showing a principal part of the semiconductor device. In each of FIG. 1 to FIG. 10, FIG. 12 to FIG. 14 and FIG. 16 to FIG. 24, a cross-sectional view of a cross section A-A is shown on a left side, and a cross-sectional view of a cross section B-B is shown on a right side. Note that the cross-sectional view at the position corresponding to a line A-A in the plan views of FIG. 11 and FIG. 15 corresponds to the cross-sectional view A-A, and the cross-sectional view at the position corresponding to a line B-B in the plan views of FIG. 11 and FIG. 15 corresponds to the cross-sectional view B-B.

First, an SOI (Silicon On Insulator) substrate 1 is prepared as shown in FIG. 1.

The SOI substrate 1 includes a semiconductor substrate (support substrate) SB serving as a support substrate, an insulating layer (buried insulating film) BX formed over a main surface of the semiconductor substrate SB, and a semiconductor layer SM formed over a main surface of the insulating layer BX.

The semiconductor substrate SB is a support substrate which supports the insulating layer BX and a structure above the insulating layer BX and is also a semiconductor substrate. The semiconductor substrate SB is preferably a single crystal silicon substrate and is made of, for example, p type single crystal silicon. For example, the semiconductor substrate SB can be formed of single crystal silicon having a specific resistance of about 1 to 10 Ωcm. A thickness of the semiconductor substrate SB may be, for example, about 700 to 750 μm. The insulating layer BX is preferably a silicon oxide film, and a thickness of the insulating layer BX may be, for example, about 10 to 30 nm. When the insulating layer BX is a silicon oxide film, the insulating layer BX may be considered as a buried oxide film, that is, a BOX (Buried Oxide) layer. The semiconductor layer SM is made of, for example, single crystal silicon. The semiconductor layer SM can be formed of, for example, single crystal silicon having a specific resistance of about 1 to 10 Ωcm. A thickness of the semiconductor layer SM is smaller than the thickness of the semiconductor substrate SB serving as a support substrate, and the thickness of the semiconductor layer SM may be, for example, about 5 to 25 nm. The semiconductor substrate SB, the insulating layer BX and the semiconductor layer SM form the SOI substrate 1.

Also, in the SOI substrate 1, the main surface of the semiconductor substrate SB on a side in contact with the insulating layer BX is referred to as an upper surface of the semiconductor substrate SB, and the main surface of the semiconductor substrate SB on a side opposite to the upper surface is referred to as a rear surface of the semiconductor substrate SB. In addition, in the SOI substrate 1, the main surface of the insulating layer BX on a side in contact with the semiconductor substrate SB is referred to as a lower surface of the insulating layer BX, the main surface on a side in contact with the semiconductor layer SM is referred to as an upper surface of the insulating layer BX, and the upper surface and the lower surface of the insulating layer BX are surfaces on the opposite sides to each other. Further, the main surface of the semiconductor layer SM on a side in contact with the insulating layer BX is referred to as a lower surface of the semiconductor layer SM, and the main surface of the semiconductor layer SM on a side opposite to the lower surface is referred to as an upper surface of the semiconductor layer SM.

Although there is no limitation on a manufacturing method of the SOI substrate 1, the SOI substrate 1 can be manufactured by, for example, the SIMOX (Silicon Implanted Oxide) method. In the SIMOX method, $O_2$ (oxygen) is ion-implanted into the main surface of the semiconductor substrate made of silicon (Si) with high energy, and Si (silicon) and oxygen are combined by the subsequent heat treatment, thereby forming the insulating layer BX made of silicon oxide at a position slightly deeper than the surface of the semiconductor substrate. In this case, a thin film of silicon (Si) remaining on the insulating layer BX serves as the semiconductor layer SM, and the semiconductor substrate below the insulating layer BX serves as the semiconductor substrate SB. Alternatively, the SOI substrate 1 may be formed by the bonding method. In the bonding method, for example, after forming the insulating layer BX by oxidizing a surface of a first semiconductor substrate made of silicon (Si), a second semiconductor substrate made of silicon (Si) is pressure-bonded to the first semiconductor substrate under high temperature, and then, the second semiconductor substrate is made into a thin film. In this case, the thin film of the second substrate remaining on the insulating layer BX serves as the semiconductor layer SM, and the first semiconductor substrate below the insulating layer BX serves as the semiconductor substrate SB. Furthermore, it is also possible to manufacture the SOI substrate 1 by still another method such as the smart cut process.

Figure 2:
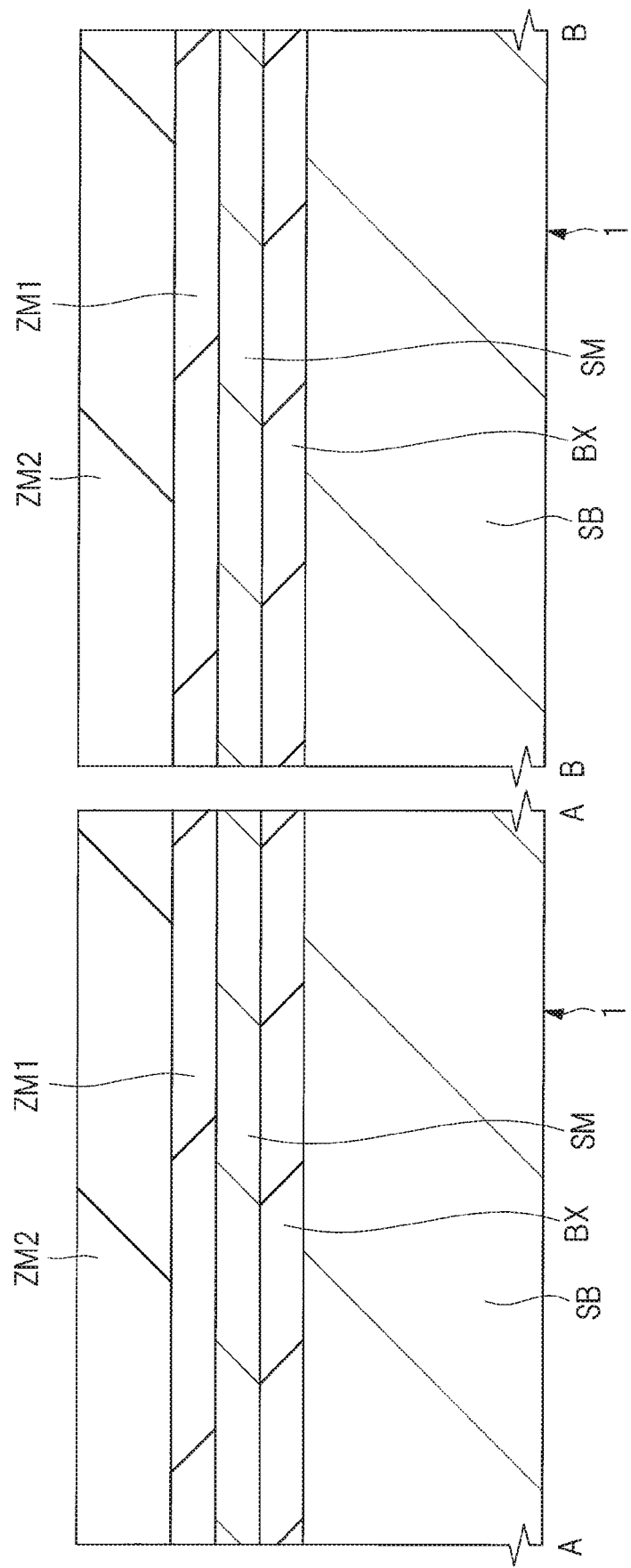
FIG. 2 is a cross-sectional view showing a principal part of the semiconductor device in the manufacturing process subsequent to FIG. 1.

Next, as shown in FIG. 2, an insulating film (pad insulating film) ZM1 is formed over the main surface of the SOI substrate 1, that is, over the upper surface of the semiconductor layer SM. The insulating film ZM1 is made of the same material as that of the insulating layer BX. When the insulating layer BX is made of silicon oxide, the insulating film ZM1 is also made of silicon oxide. The insulating film ZM1 can be formed by, for example, the CVD (Chemical Vapor Deposition) method.

Next, an insulating film ZM2 is formed over the insulating film ZM1. The insulating film ZM2 is made of a material different from that of the insulating film ZM1. When the insulating layer BX and the insulating film ZM1 are made of silicon oxide, it is preferable that the insulating film ZM2 is made of silicon nitride. In addition, the insulating film ZM2 is made of a material different from that of an insulating film ZM3 to be described later. The insulating film ZM2 can be formed by, for example, the CVD method. A film thickness of the insulating film ZM2 may be, for example, about 80 to 120 nm.

Through the process described above, the substrate including the semiconductor substrate SB, the insulating layer BX on the semiconductor substrate SB, the semiconductor layer SM on the insulating layer BX, the insulating film ZM1 on the semiconductor layer SM, and the insulating film ZM2 on the insulating film ZM1 has been prepared.

Figure 3:
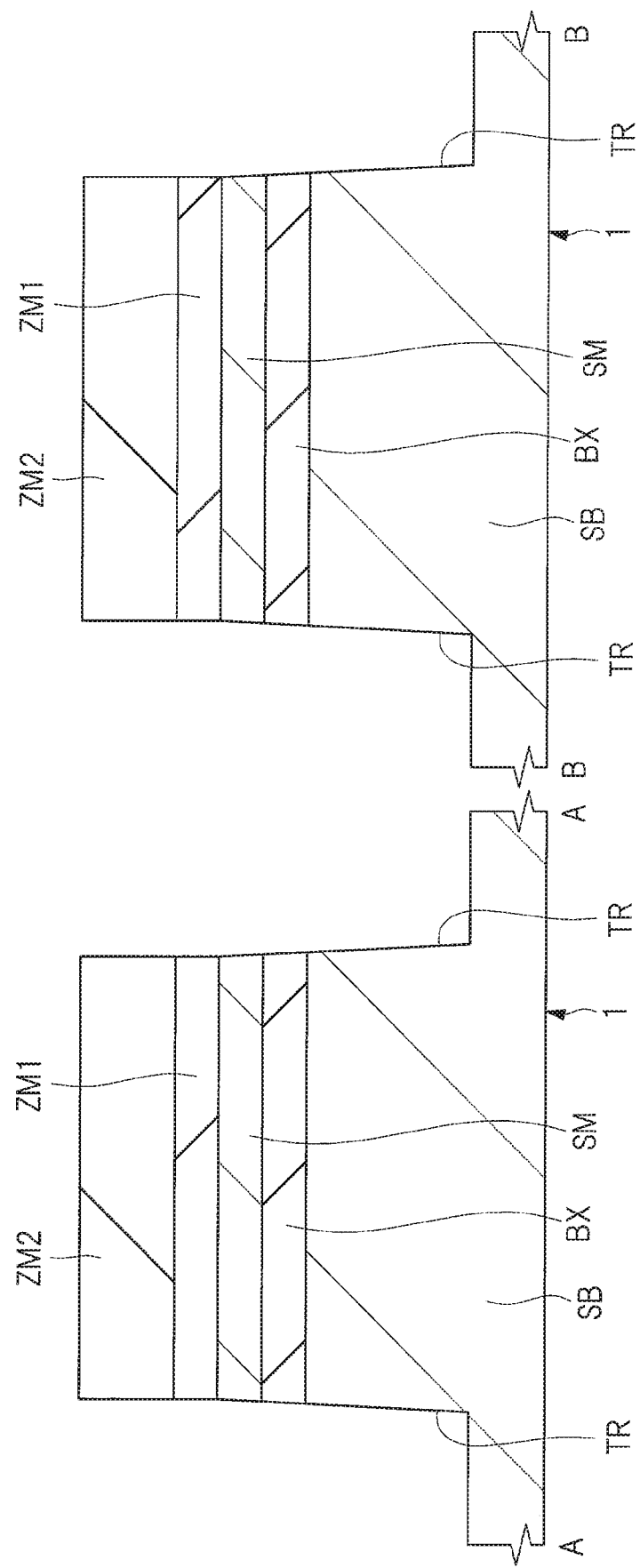
FIG. 3 is a cross-sectional view showing a principal part of the semiconductor device in the manufacturing process subsequent to FIG. 2.

Next, as shown in FIG. 3, a trench TR is formed. The trench TR is a trench for forming an element isolation region ST to be described later, that is, a trench for element isolation.

The trench TR can be formed in the following manner. That is, a photoresist pattern (not shown) is first formed on the insulating film ZM2 by the photolithography technique. This photoresist pattern has a pattern (planar shape) that exposes the insulating film ZM2 in a region where the trench TR is to be formed and covers the insulating film ZM2 in the other region. Then, the insulating film ZM2 is patterned by etching (preferably dry etching) with using the photoresist pattern as an etching mask. Consequently, the insulating film ZM2 in the region where the trench TR is to be formed is selectively removed. Subsequently, after the photoresist pattern is removed, the insulating film ZM1, the semiconductor layer SM, the insulating layer BX and the semiconductor substrate SB are etched (preferably dry-etched) with using the insulating film ZM2 as an etching mask (hard mask), thereby forming the trench TR.

The trench TR penetrates the insulating film ZM2, the insulating film ZM1, the semiconductor layer SM and the insulating layer BX, and a bottom part (bottom surface) of the trench TR reaches the semiconductor substrate SB. Namely, the bottom part (bottom surface) of the trench TR is located at the middle of the thickness of the semiconductor substrate SB. Accordingly, the bottom surface of the trench TR is located below the lower surface of the insulating layer BX, and the semiconductor substrate SB is exposed at the bottom part of the trench TR. A depth of the trench TR may be, for example, about 250 to 300 nm.

Figure 4:
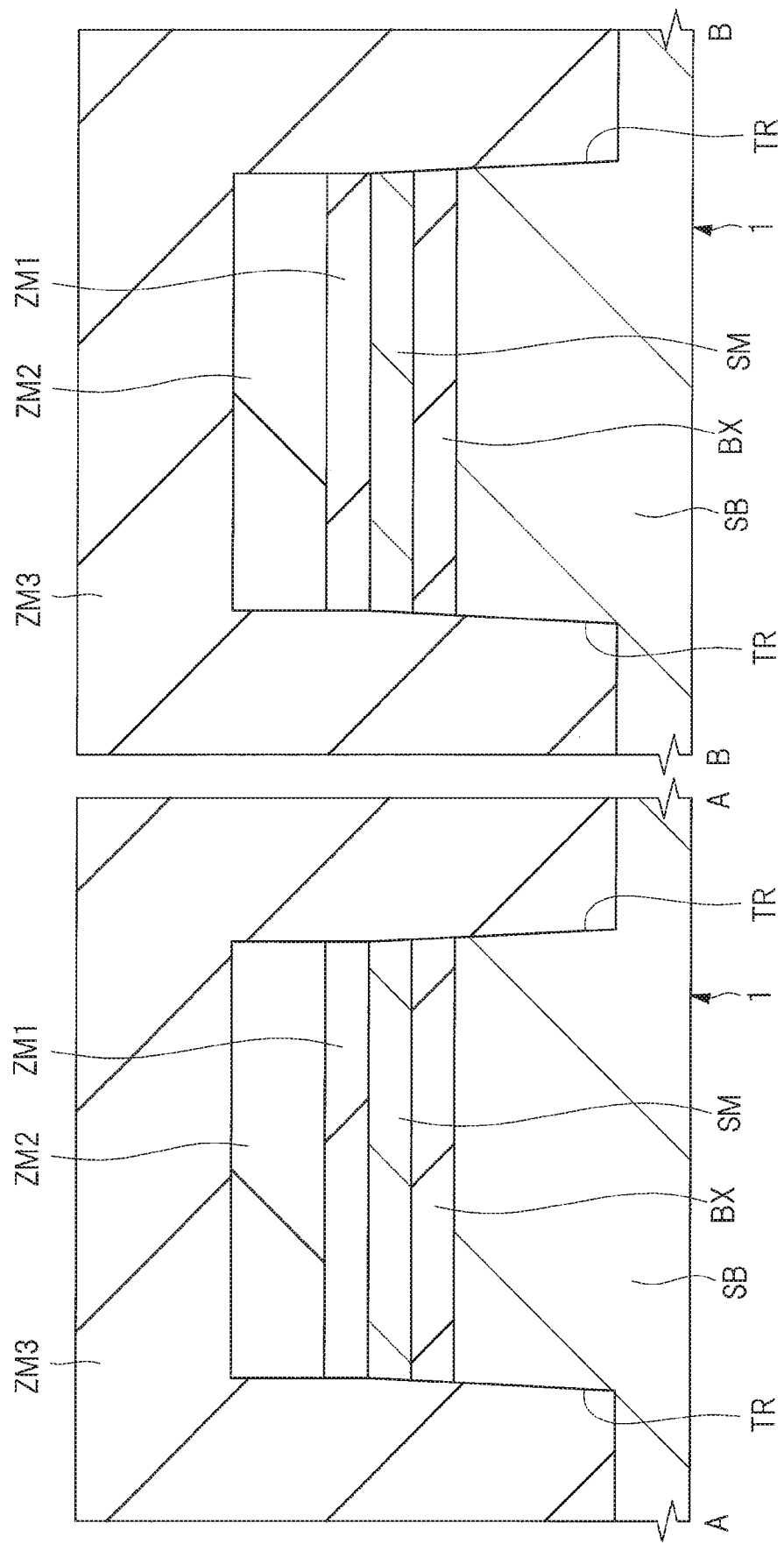
FIG. 4 is a cross-sectional view showing a principal part of the semiconductor device in the manufacturing process subsequent to FIG. 3.

Next, as shown in FIG. 4, an insulating film ZM3 is formed over the insulating film ZM2 so as to fill the trench TR. The insulating film ZM3 is an insulating film for forming the element isolation region ST, and is preferably a silicon oxide film. Thus, the insulating film ZM3, the insulating film ZM1 and the insulating layer BX are made of the same material, and are preferably made of silicon oxide. The insulating film ZM3 can be formed by the CVD method or the like. It is preferable that the insulating film ZM3 is formed to have a film thickness capable of sufficiently filling the trench TR.

Figure 5:
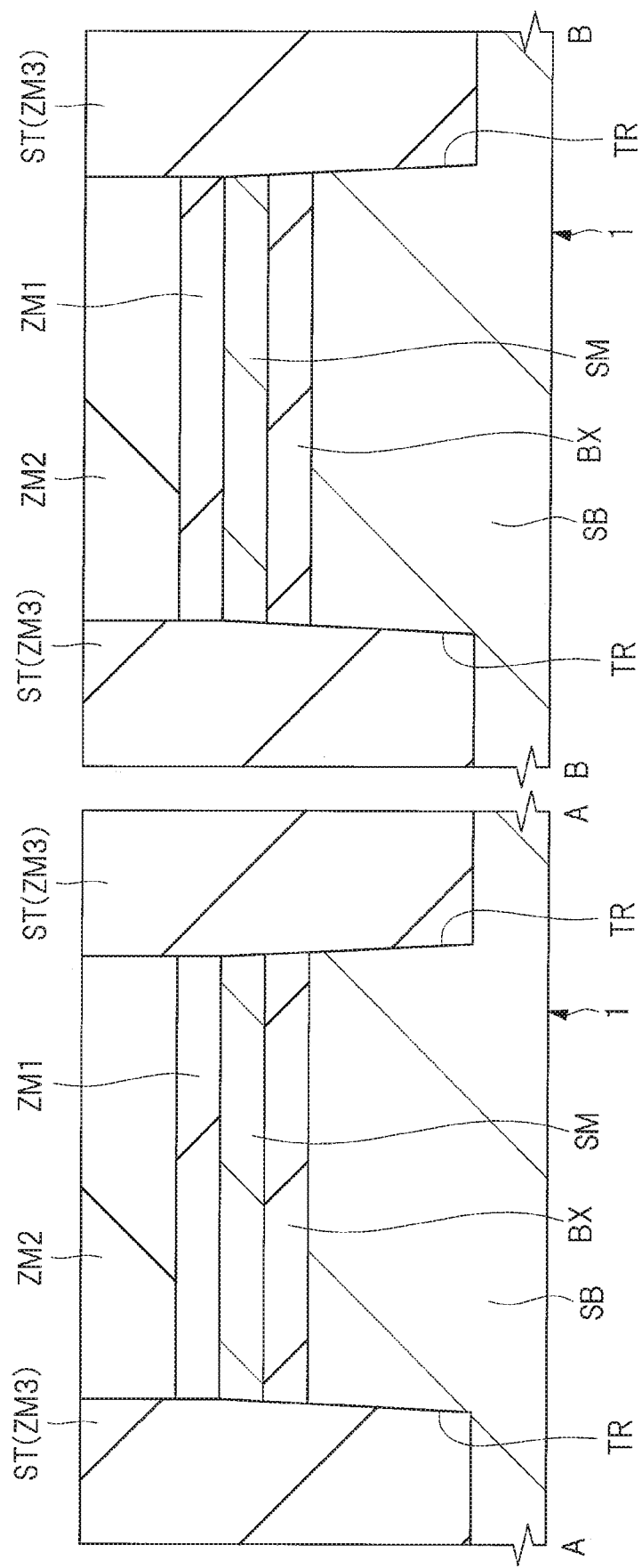
FIG. 5 is a cross-sectional view showing a principal part of the semiconductor device in the manufacturing process subsequent to FIG. 4.

Next, as shown in FIG. 5, the insulating film ZM3 is polished (polishing process) by the CMP (Chemical Mechanical Polishing) method or the like, thereby removing the insulating film ZM3 outside the trench TR and leaving the insulating film ZM3 in the trench TR. In this manner, the element isolation region (element isolation structure) ST made of the insulating film ZM3 embedded in the trench TR can be formed as shown in FIG. 5. The element isolation region ST is formed in the trench TR.

In this polishing process, the insulating film ZM2 can function as a polishing stopper film. Namely, it is possible to make the insulating film ZM2 function as a polishing stopper film by performing the polishing process under the condition that the insulating film ZM2 is hard to be polished compared with the insulating film ZM3. In other words, it is possible to make the insulating film ZM2 function as a polishing stopper film by performing the polishing process under the condition that the polishing rate of the insulating film ZM2 is lower than the polishing rate of the insulating film ZM3. In order to make the insulating film ZM2 function as a polishing stopper film, it is necessary that the insulating film ZM2 is formed of a material different from that of the insulating film ZM3. When the insulating film ZM3 is made of silicon oxide, the insulating film ZM2 is preferably made of silicon nitride. At the stage where the polishing process is finished, the upper surface of the insulating film ZM2 is exposed and the element isolation region ST is buried in the trench TR. Also, as shown in FIG. 5, the upper surface of the element isolation region ST is located at approximately the same height position as the upper surface of the insulating film ZM2.

In addition, there may be a case where the element isolation region ST is wet-etched to lower the height position of the upper surface of the element isolation region ST after the structure of FIG. 5 is obtained by performing the CMP process of the insulating film ZM3 and before the process of FIG. 6 to be described later (removal process of the insulating film ZM2) is performed. In this case, the height position of the upper surface of the element isolation region ST is lower than that of the upper surface of the insulating film ZM2, but it is preferable that the height position of the upper surface of the element isolation region ST is almost equal to or higher than that of the upper surface of the insulating film ZM1. Hydrofluoric acid can be suitably used for the wet etching in this case.

Figure 6:
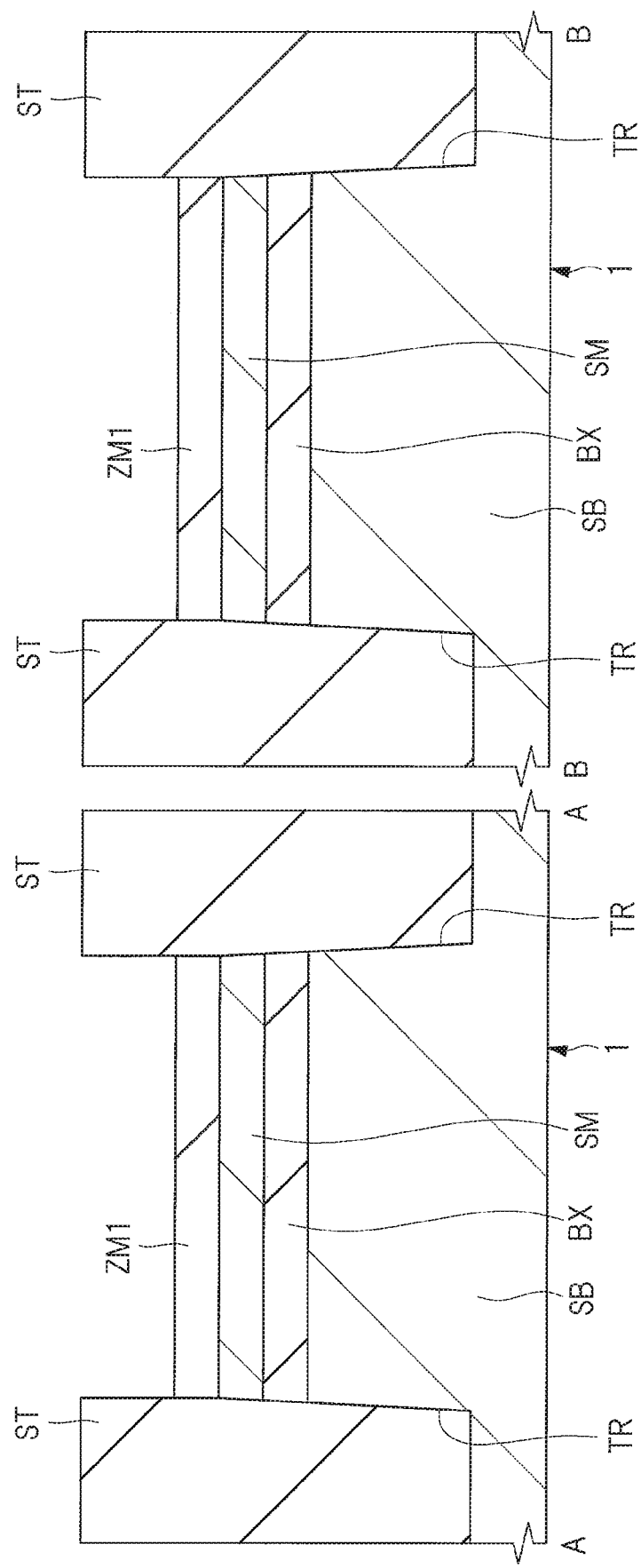
FIG. 6 is a cross-sectional view showing a principal part of the semiconductor device in the manufacturing process subsequent to FIG. 5.

Next, as shown in FIG. 6, the insulating film ZM2 is removed by etching. When the insulating film ZM2 has been removed by etching, the upper surface of the insulating film ZM1 is exposed, and the insulating film ZM1 can be made to function as an etching stopper film.

It is preferable that the insulating film ZM2 is removed by etching under the condition that the insulating film ZM1 and the element isolation region ST are hard to be etched compared with the insulating film ZM2 in this etching process of the insulating film ZM2. In other words, it is preferable that the insulating film ZM2 is removed by etching under the condition that the etching rate of each of the insulating film ZM1 and the element isolation region ST is lower than the etching rate of the insulating film ZM2. In this manner, the insulating film ZM2 can be selectively removed by etching while suppressing or preventing the insulating film ZM1 and the element isolation region ST from being etched.

Also, the wet etching can be suitably used for the etching of the insulating film ZM2. When the insulating film ZM2 is made of silicon nitride and the insulating film ZM1 and the element isolation region ST are made of silicon oxide, hot phosphoric acid (heated phosphoric acid) can be suitably used as the etching solution used for the etching of the insulating film ZM2.

In this manner, the element isolation region ST having the STI structure is formed by the STI (Shallow Trench Isolation) method. At the stage where the SOI substrate 1 is prepared, the semiconductor layer SM is formed over the entire upper surface of the semiconductor substrate SB via the insulating layer BX, but the semiconductor layer SM is separated into a plurality of regions (active regions) each surrounded by the element isolation region ST when the element isolation region ST has been formed.

The trench TR and the element isolation region ST that fills the trench TR penetrate the insulating film ZM1, the semiconductor layer SM and the insulating layer BX, and bottom parts thereof reach the semiconductor substrate SB and a lower part of the element isolation region ST is located inside the semiconductor substrate SB. Namely, the element isolation region ST is buried in the trench TR that is formed from the insulating film ZM1 through the semiconductor layer SM and the insulating layer BX to the semiconductor substrate SB. Therefore, a part of the element isolation region ST is located below the lower surface of the insulating layer BX. Namely, the bottom surface (lower surface) of the element isolation region ST is located at a position deeper than the lower surface of the insulating layer BX, and a part (lower part) of the element isolation region ST protrudes from the lower surface of the insulating layer BX toward the lower side.

Figure 7:
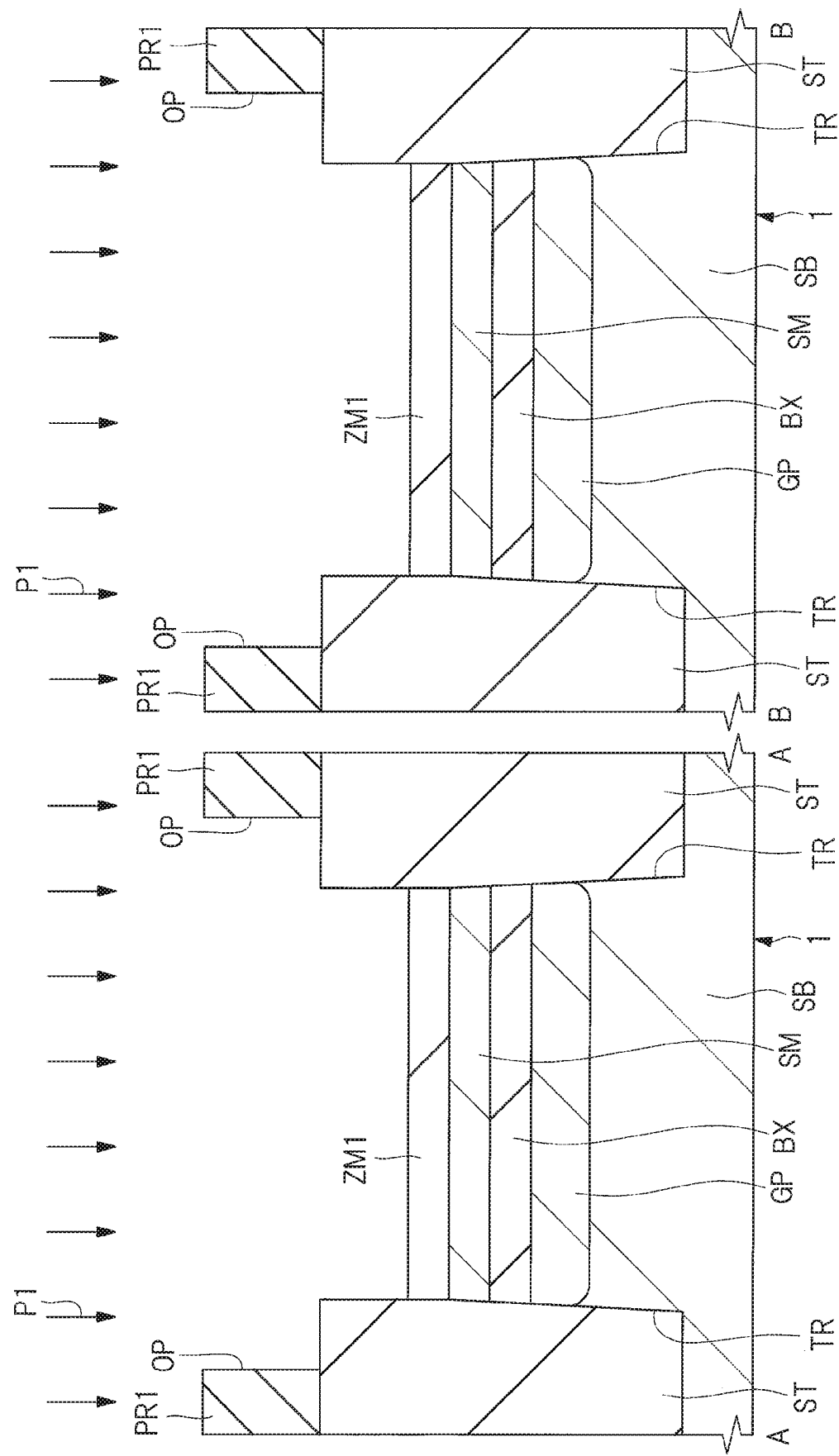
FIG. 7 is a cross-sectional view showing a principal part of the semiconductor device in the manufacturing process subsequent to FIG. 6.

Next, as shown in FIG. 7, a photoresist pattern PR1 is formed as a mask layer over the SOI substrate 1 by the photolithography technique. The photoresist pattern PR1 has an opening OP which exposes a planar region in which a semiconductor region GP is to be formed, and a side surface (inner wall) of the opening OP is located on the element isolation region ST.

Next, ion implantation for adjusting a threshold value is performed to the semiconductor substrate SB of the SOI substrate 1 with using the photoresist pattern PR1 as a mask (ion implantation blocking mask). This ion implantation is schematically indicated by arrows in FIG. 7, and is hereinafter referred to as ion implantation P1. Also, in FIG. 7, the region in which an impurity has been introduced by the ion implantation P1 is denoted by a reference character GP and is illustrated as a semiconductor region (impurity diffusion layer) GP. The impurity is introduced into the semiconductor substrate SB of the SOI substrate 1 by the ion implantation P1, thereby forming the semiconductor region GP.

The ion implantation P1 is performed for controlling the threshold voltage (threshold value) of the MISFET to be formed later on the semiconductor layer SM. Namely, the semiconductor region GP is formed to control the threshold voltage of the MISFET formed on the semiconductor layer SM. In the manufactured semiconductor device, the threshold voltage of the MISFET formed on the semiconductor layer SM above the semiconductor region GP can be controlled by applying a predetermined voltage (potential) to the semiconductor region GP.

In this ion implantation P1, impurity ions are introduced into the semiconductor substrate SB of the SOI substrate 1, but it is desirable that impurity ions are not introduced into the semiconductor layer SM of the SOI substrate 1. This is because the impurity ions introduced into the semiconductor layer SM by the ion implantation P1 cause the variation in electrical characteristics of the MISFET to be formed later on the semiconductor layer SM.

Therefore, it is preferable that the ion implantation P1 is performed at the high implantation energy capable of passing the impurity ions through the semiconductor layer SM. The implantation energy of the ion implantation P1 is adjusted depending on the thickness of the insulating film ZM1, the thickness of the semiconductor layer SM and the thickness of the insulating layer BX, and is set so that the range (distance) of the impurity ions reaches at least the inside of the semiconductor substrate SB. Accordingly, it is possible to implant the impurity ions into the semiconductor substrate SB of the SOI substrate 1 by the ion implantation P1 without implanting the impurity ions into the semiconductor layer SM of the SOI substrate 1.

Also, in the ion implantation P1, an impurity is ion-implanted into the semiconductor substrate SB below the insulating layer BX in the SOI substrate 1, but it is preferable that impurity ions are implanted also into a region close to the insulating layer BX (region adjacent to the insulating layer BX) in the semiconductor substrate SB. Namely, it is preferable that the semiconductor region GP formed in the semiconductor substrate SB is in contact with (adjacent to) the insulating layer BX. The threshold value of the MISFET to be formed later on the semiconductor layer SM can be controlled by adjusting the impurity concentration of the semiconductor region GP by the implantation amount (dose amount) of the ion implantation P1. The photoresist pattern PR1 is removed after the ion implantation P1.

It is preferable that the impurity ions are not implanted into the semiconductor layer SM of the SOI substrate 1 as far as possible in the ion implantation P1. For this purpose, however, substantially high ion implantation energy is needed. Also, the dose amount is substantially large in the ion implantation P1, and is about ten times as large as the dose amount of the standard channel-dope ion implantation. One example of the dose amount of the ion implantation P1 is about $1 \times 10^{12}$ to $1 \times 10^{14}/cm^2$. Therefore, in the ion implantation P1, impurity ions are considerably implanted also into a part of the element isolation region ST that is not covered with the photoresist pattern PR1. Namely, in the ion implantation P1, impurity ions are considerably implanted also into a part of the element isolation region ST adjacent to the semiconductor layer SM in plan view. When impurity ions are implanted by ion implantation into the element isolation region ST, the element isolation region ST becomes susceptible to etching, and the etching rate thereof is likely to be high in the subsequent etching process. Therefore, when the ion implantation P1 for forming the semiconductor region GP is performed, a divot DT to be described later is likely to be formed in the etching process performed after the ion implantation.

Also, a p type impurity (for example, boron) or an n type impurity (for example, phosphorus or arsenic) is ion-implanted in the ion implantation P1. When a p type impurity is ion-implanted in the ion implantation P1, the semiconductor region GP is a p type semiconductor region into which the p type impurity is introduced. Also, when an n type impurity is ion-implanted in the ion implantation P1, the semiconductor region GP is an n type semiconductor region into which the n type impurity is introduced.

Further, it is not desirable that a photoresist layer is directly formed on the surface (silicon surface) of the semiconductor layer SM and on the surface (silicon surface) of the semiconductor substrate SB. In this case, the photoresist pattern PR1 is formed in the state where the semiconductor layer SM and the semiconductor substrate SB are not exposed, and it is thus possible to prevent the photoresist film for forming the photoresist pattern PR1 from being in contact with the surface (silicon surface) of the semiconductor layer SM and the surface (silicon surface) of the semiconductor substrate SB.

Figure 8:
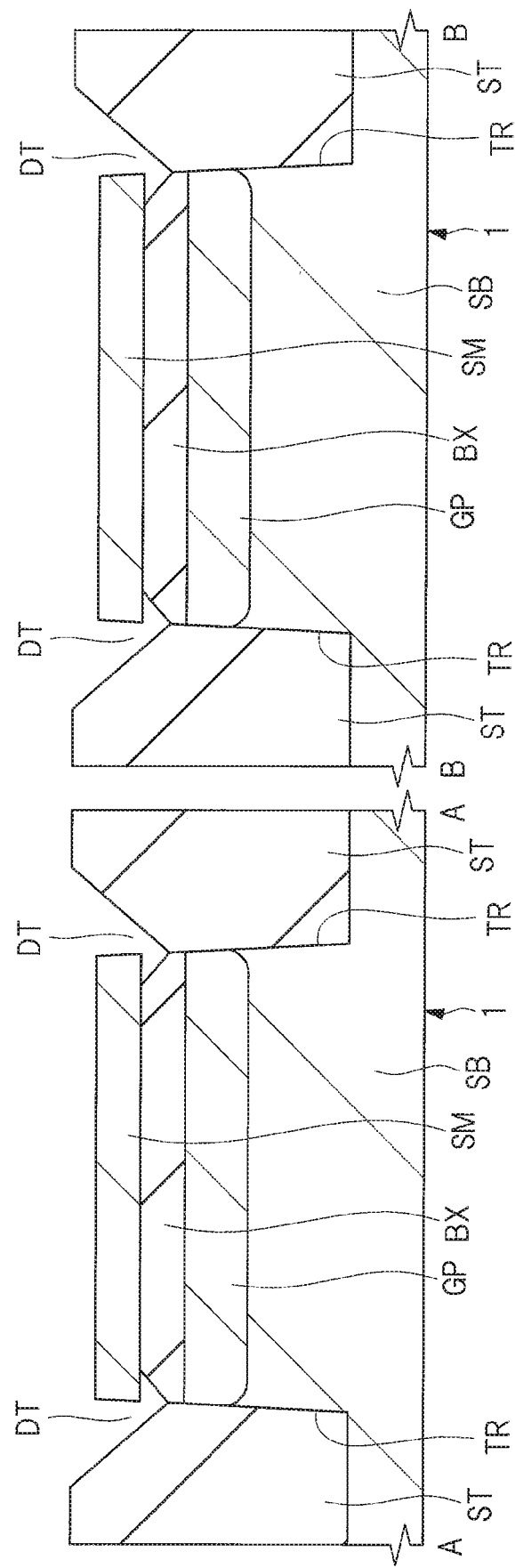
FIG. 8 is a cross-sectional view showing a principal part of the semiconductor device in the manufacturing process subsequent to FIG. 7.

Next, as shown in FIG. 8, the insulating film ZM1 of the SOI substrate 1 is removed by etching. This process is referred to as an etching process of the insulating film ZM1.

In the etching process of the insulating film ZM1, it is preferable that the insulating film ZM1 of the SOI substrate 1 is removed by etching under the condition that the semiconductor layer SM and the semiconductor substrate SB are hard to be etched compared with the insulating film ZM1 and the insulating layer BX. In other words, it is preferable that the insulating film ZM1 of the SOI substrate 1 is removed by etching under the condition that the etching rate of each of the semiconductor layer SM and the semiconductor substrate SB is lower than the etching rate of each the insulating film ZM1 and the insulating layer BX. In this manner, the insulating film ZM1 of the SOI substrate 1 is removed by etching, and the semiconductor layer SM of the SOI substrate 1 can be made to function as an etching stopper, so that it is possible to suppress or prevent the semiconductor layer SM of the SOI substrate 1 from being etched. In the etching process of the insulating film ZM1, wet etching can be suitably used, and hydrofluoric acid can be suitably used as etching solution when the insulating film ZM1 is made of silicon oxide.

When "hydrofluoric acid" is mentioned in this application, it includes diluted hydrofluoric acid.

The etching process of the insulating film ZM1 is started in the state where the upper surface of the element isolation region ST and the upper surface of the insulating film ZM1 are exposed. Therefore, in the etching process of the insulating film ZM1, an upper part of the element isolation region ST is also etched in addition to the insulating film ZM1 of the SOI substrate 1. Further, the height position of the upper surface of the element isolation region ST is lowered to some extent in some cases by etching the element isolation region ST by continuing the etching for a while even after the insulating film ZM1 is removed and the upper surface of the semiconductor layer SM is exposed. Accordingly, in the etching process of the insulating film ZM1, the element isolation region ST is also etched to an extent approximately equal to or larger than the etching amount (etching thickness) of the insulating film ZM1.

At this time, a divot (concave part, hollow part) DT is formed in the element isolation region ST in some cases. The divot DT can be regarded as a hollow part. The divot DT is likely to be formed at an end part (end part adjacent to the semiconductor layer SM) of the element isolation region ST. The divot DT of the element isolation region ST is formed when the element isolation region ST is excessively etched by the solution (etching solution) used in the etching process.

The divot DT of the element isolation region ST may be formed by excessively etching the element isolation region ST in the etching process of the insulating film ZM1. There is almost no divot DT formed in the element isolation region ST before the etching process of the insulating film ZM1 is performed, but the element isolation region ST is excessively etched in the etching process of the insulating film ZM1, so that the divot DT is formed and the depth thereof is increased. In addition, even when the divot DT is not formed in the etching process of the insulating film ZM1, the element isolation region ST is excessively etched in the various etching (wet etching) processes before the process of forming a gate insulating film GF is performed, so that the divot DT is formed.

One of the causes for the formation of the divot DT by the excessive etching of the element isolation region ST in the etching process of the insulating film ZM1 or the subsequent etching process is that the ion implantation process is performed before the etching process of the insulating film ZM1 and impurity ions are implanted also into the element isolation region ST in the ion implantation. When impurity ions are ion-implanted into the element isolation region ST, the element isolation region ST becomes susceptible to etching, and the etching rate thereof is likely to be high in performing the etching process.

Accordingly, it is also conceivable that impurity ions are prevented from being ion-implanted into the element isolation region ST before the etching process of the insulating film ZM1 so as to prevent the excessive etching of the element isolation region ST in the etching process of the insulating film ZM1, thereby suppressing the formation of the divot DT. However, it is sometimes desired that the semiconductor region GP is formed in the semiconductor substrate SB of the SOI substrate 1 so as to make it possible to adjust the threshold voltage of the MISFET formed on the semiconductor layer SM. In such a case, it is desirable that the semiconductor region GP is formed by performing the ion implantation P1 before the etching process of the insulating film ZM1 is performed. This is because, if the semiconductor region GP is to be formed by the ion implantation after the etching process of the insulating film ZM1 and before the formation of the gate insulating film, a photoresist layer for forming a photoresist pattern corresponding to the photoresist pattern PR1 described above is formed directly on the exposed surface (silicon surface) of the semiconductor layer SM, and this is not desirable. However, if the semiconductor region GP is to be formed by the ion implantation after the gate insulating film is formed or after a silicon film PS to be described later is formed, the gate insulating film and the silicon film PS are affected by the ion implantation and the characteristics of the MISFET may be affected, and this is also not desirable. Further, if the semiconductor region GP is to be formed by the ion implantation after the gate electrode is formed, there is a fear that the semiconductor region GP cannot be correctly formed due to the hindrance of the gate electrode. Consequently, it is desirable that the semiconductor region GP is formed by performing the ion implantation P1 before the etching process of the insulating film ZM1 is performed.

When the semiconductor region GP is formed by performing the ion implantation P1, impurity ions to be implanted are implanted not only into the semiconductor substrate SB of the SOI substrate 1 but also into apart of the element isolation region ST, which is not covered with the photoresist pattern (PR1). Namely, the impurity ions are implanted also into apart of the element isolation region ST adjacent to the semiconductor layer SM in plan view. Therefore, after the semiconductor region GP is formed by performing the ion implantation P1 and just before the etching process of the insulating film ZM1 is performed, impurity ions are substantially implanted into the element isolation region ST at a position (region) adjacent to the semiconductor layer SM in plan view. When impurity ions are implanted by the ion implantation into the element isolation region ST, the element isolation region ST is damaged and becomes susceptible to etching, and the etching rate thereof is likely to be high. Namely, in the element isolation region ST, not only the region in which impurity ions implanted by the ion implantation are present but also the region through which impurity ions implanted by the ion implantation have passed becomes susceptible to etching (etching rate thereof is likely to be high). Accordingly, when impurity ions are substantially implanted into the element isolation region ST at a position (region) adjacent to the semiconductor layer SM in plan view, the etching rate of the element isolation region ST is likely to be high in performing the etching process of the insulating film ZM1, and the divot DT is likely to be formed at the position adjacent to the semiconductor layer SM.

The formation of the divot DT may cause the decrease of reliability of the manufactured semiconductor device as described in the study example below, and it is thus desirable to implement some kind of measures. Thus, in the present embodiment, the decrease of reliability of the semiconductor device due to the divot DT is prevented by forming a buried insulating film UZ through the process shown in FIG. 9 to FIG. 11 (process of forming the buried insulating film UZ).

Figure 9:
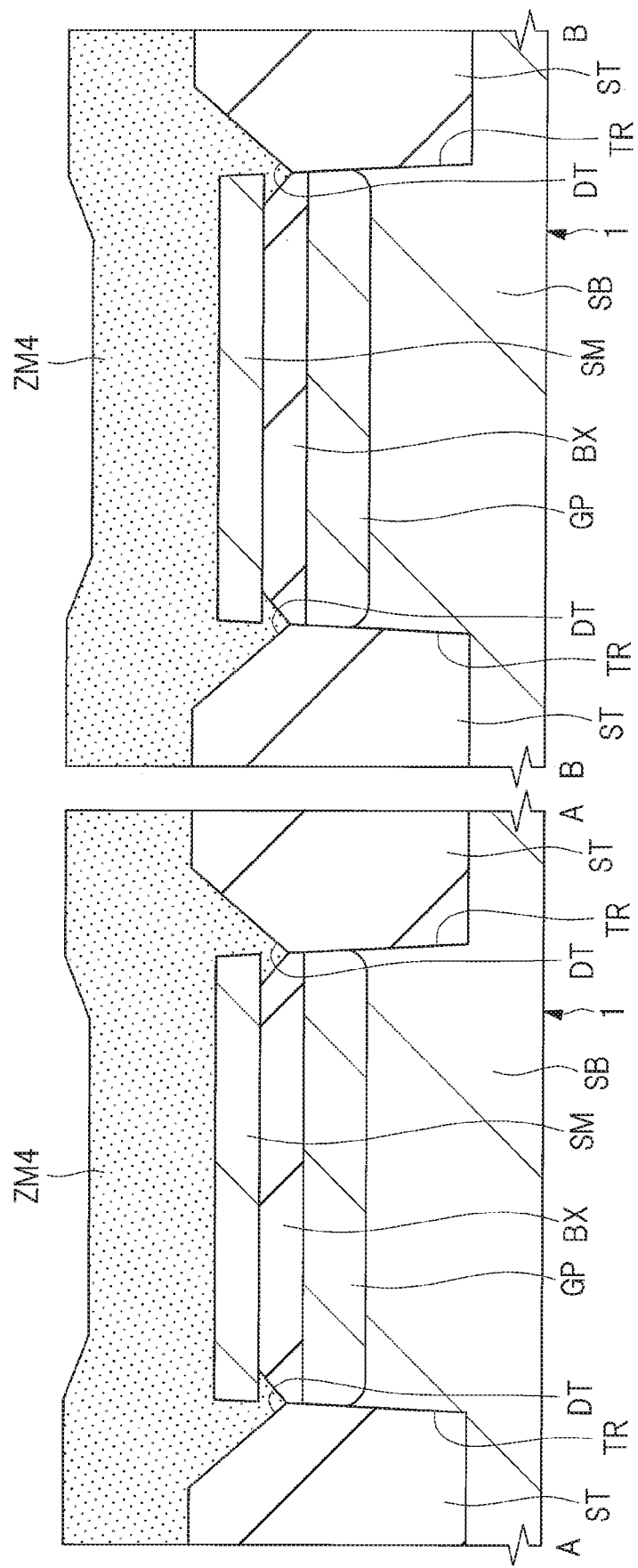
FIG. 9 is a cross-sectional view showing a principal part of the semiconductor device in the manufacturing process subsequent to FIG. 8.

Namely, after the etching process of the insulating film ZM1 is performed, an insulating film ZM4 is formed over the SOI substrate 1 as shown in FIG. 9. The insulating film ZM4 is formed over the entire main surface of the SOI substrate 1 including the upper surface of the element isolation region ST. Therefore, the insulating film ZM4 is formed on the semiconductor layer SM and the element isolation region ST so as to fill the inside of the divot DT.

The insulating film ZM4 is an insulating film for forming the buried insulating film UZ described later. A silicon nitride film or a silicon oxide film can be suitably used as the insulating film ZM4. It is particularly preferable that a silicon nitride film is used as the insulating film ZM4 because it is easy to suppress or prevent the buried insulating film UZ to be described later from being etched in the cleaning process (hydrofluoric acid cleaning or RCA cleaning) before forming the gate insulating film. The insulating film ZM4 can be formed by the CVD method or the like.

Figure 10:
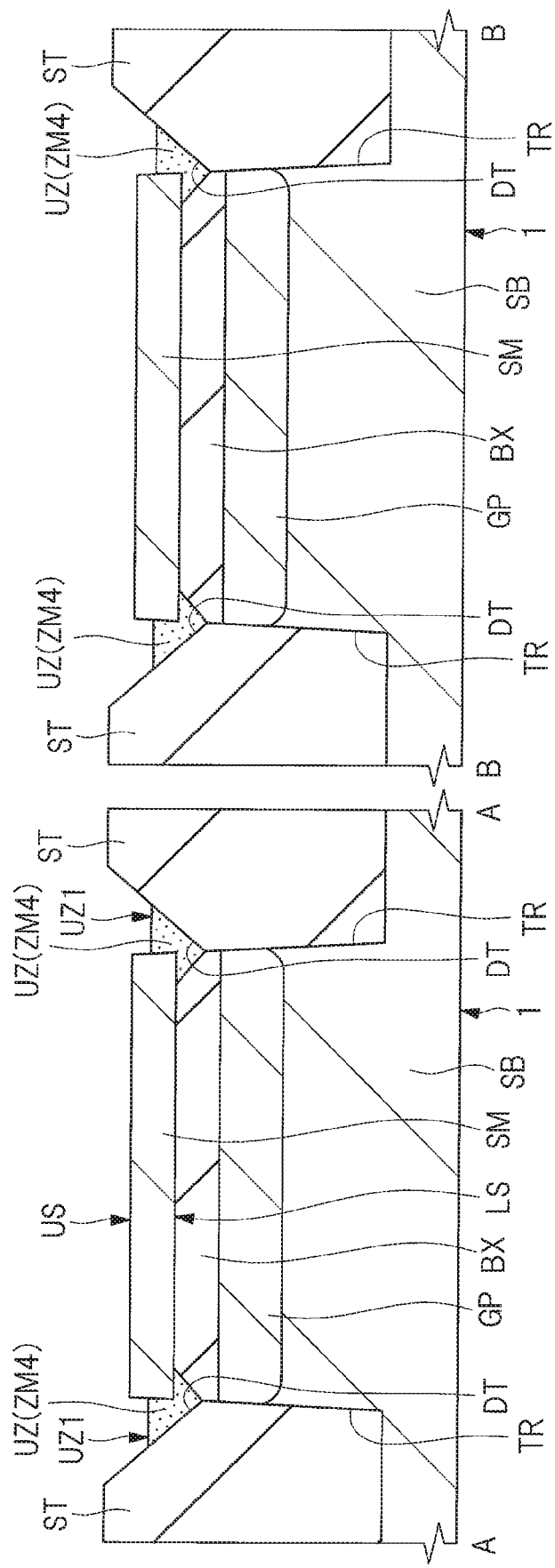
FIG. 10 is a cross-sectional view showing a principal part of the semiconductor device in the manufacturing process subsequent to FIG. 9.

Next, as shown in FIG. 10, the insulating film ZM4 is etched back by the anisotropic etching technique. This process is referred to as an etch-back process of the insulating film ZM4. By performing the etch-back process of the insulating film ZM4, the insulating film ZM4 outside the divot DT is removed, and a part of the insulating film ZM4 is left in the divot DT. In this manner, the upper surface of the semiconductor layer SM is exposed, and the buried insulating film UZ is formed in the divot DT. The buried insulating film UZ is made of the insulating film ZM4 left in the divot DT.

Figure 11:
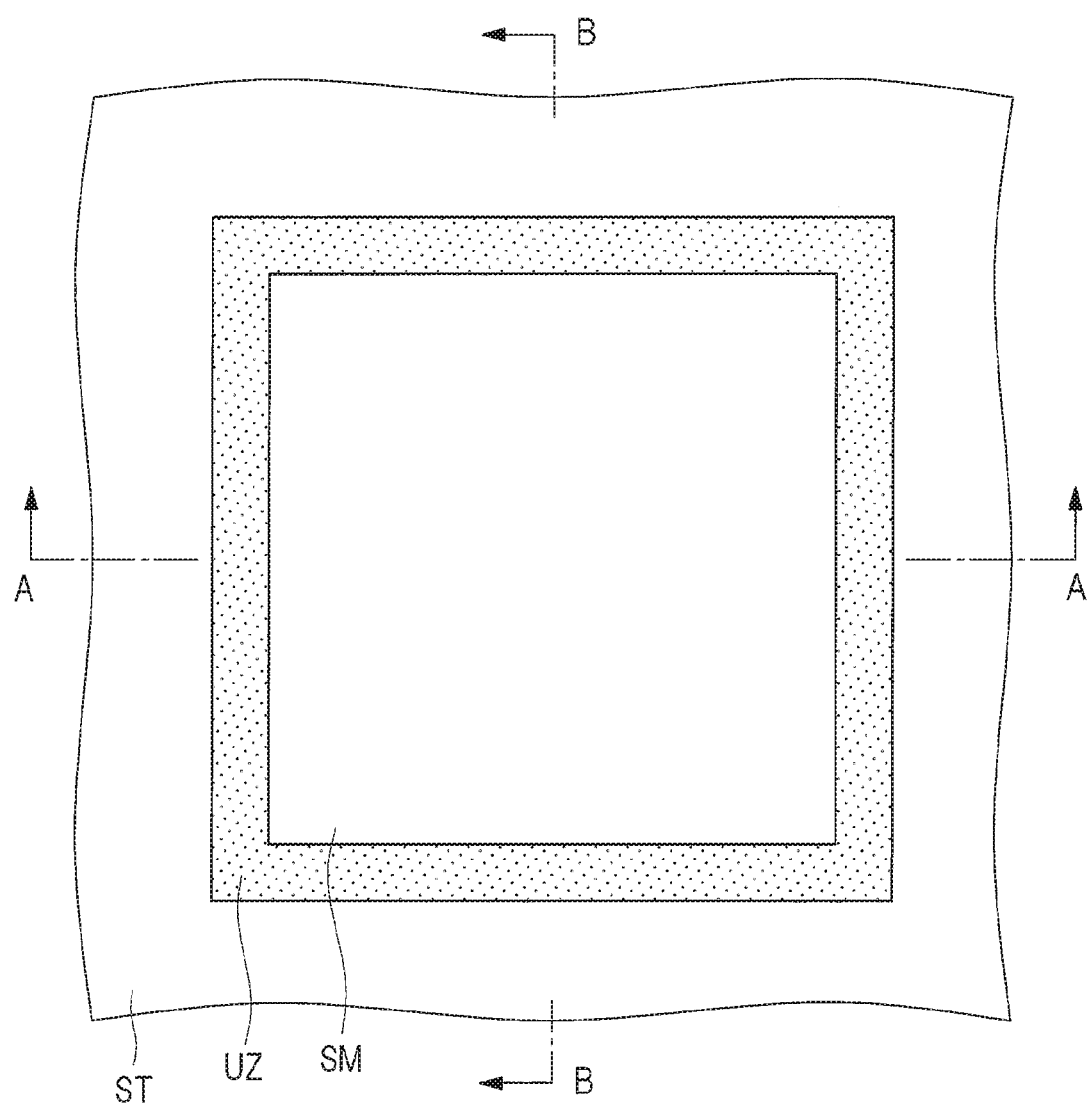
FIG. 11 is a plan view showing a principal part of the semiconductor device in the same manufacturing process as FIG. 10.

FIG. 11 is a plan view showing a principal part of the semiconductor device in the same manufacturing process as FIG. 10. Namely, FIG. 10 and FIG. 11 show the state where the etch-back process of the insulating film ZM4 is finished, and the cross-sectional view at the position of the line A-A of FIG. 11 corresponds to the cross-sectional view (cross-sectional view A-A) on the left side of FIG. 10 and the cross-sectional view at the position of the line B-B of FIG. 11 corresponds to the cross-sectional view (cross-sectional view B-B) on the right side of FIG. 10. Further, in order to make the region where the buried insulating film UZ is to be formed easy to see, dot hatching is applied to the buried insulating film UZ instead of line hatching in FIG. 10 and subsequent drawings, and thus, dot hatching is applied to the insulating film ZM4 for forming the buried insulating film UZ instead of line hatching in FIG. 9.

As described above, the divot DT is formed at the position (region) adjacent to the semiconductor layer SM in plan view, and thus the buried insulating film UZ filling the divot DT is also formed at the position (region) adjacent to the semiconductor layer SM in plan view. Namely, since the divot DT is formed so as to surround the semiconductor layer SM in plan view, the buried insulating film UZ filling the divot DT is also formed so as to surround the semiconductor layer SM in plan view (see FIG. 11).

The buried insulating film UZ is formed so as to fill the divot DT, but the height position of the upper surface of the buried insulating film UZ needs to be equal to or lower than the height position of the upper surface of the semiconductor layer SM. This is because the etch-back process of the insulating film ZM4 needs to be performed until the insulating film ZM4 on the semiconductor layer SM is removed and the upper surface of the semiconductor layer SM is exposed. When the height position of the upper surface of the buried insulating film UZ is made equal to or lower than the height position of the upper surface of the semiconductor layer SM, the insulating film ZM4 is not left on the upper surface of the semiconductor layer SM, and the upper surface of the semiconductor layer SM is exposed.

In addition, the height position of the upper surface of the buried insulating film UZ needs to be equal to or higher than the height position of the lower surface of the semiconductor layer SM. This is because, when the height position of the upper surface of the buried insulating film UZ is lower than the height position of the lower surface of the semiconductor layer SM, the problem to be described in the study example below may occur.

Accordingly, the height position of the upper surface of the buried insulating film UZ is equal to the height position of the upper surface of the semiconductor layer SM, is equal to the height position of the lower surface of the semiconductor layer SM, or is lower than the height position of the upper surface of the semiconductor layer SM and higher than the height position of the lower surface of the semiconductor layer SM. Namely, the height position of the upper surface of the buried insulating film UZ is located between the height position of the upper surface of the semiconductor layer SM and the height position of the lower surface of the semiconductor layer SM in the height direction. The height position of the upper surface of the buried insulating film UZ can be controlled by adjusting the conditions of the etch-back process of the insulating film ZM4 (for example, etching rate and etching time). Note that "height" or "height position" mentioned in the present embodiment and the second embodiment below corresponds to the height or the height position in the direction perpendicular to the main surface of the SOI substrate 1, and thus corresponds also to the height or the height position in the direction perpendicular to the main surface (upper surface) of the semiconductor substrate SB constituting the SOI substrate 1. In addition, in FIG. 10, the upper surface of the buried insulating film UZ is denoted by a reference character UZ1, the upper surface of the semiconductor layer SM is denoted by a reference character US, and the lower surface of the semiconductor layer SM is denoted by a reference character LS.

In the above-described manner, the structure in which the buried insulating film UZ is buried in the divot DT is obtained.

Next, a semiconductor element such as MISFET (transistor) is formed on the semiconductor layer SM.

By forming the element isolation region ST, the semiconductor layer SM is separated into a plurality of regions (active regions) each surrounded by the element isolation region ST in plan view, and the MISFET is formed on the semiconductor layer SM in each of the active regions. The semiconductor layer SM in each of the active regions is surrounded by the element isolation region ST in plan view, and the lower surface thereof is adjacent to the insulating layer BX. Therefore, the semiconductor layer SM in each of the active regions is surrounded by the element isolation region ST and the insulating layer BX. Note that, as is apparent from FIG. 11, the buried insulating film UZ is interposed between the semiconductor layer SM and the element isolation region ST, the semiconductor layer SM is surrounded by the buried insulating film UZ, and the buried insulating film UZ is surrounded by the element isolation region ST in plan view. The buried insulating film UZ is in contact with the element isolation region ST, the semiconductor layer SM and the insulating layer BX. The element isolation region ST and the semiconductor layer SM may not be in contact with each other because the buried insulating film UZ is interposed therebetween.

The process of forming the MISFET will be described in detail below.

Figure 12:
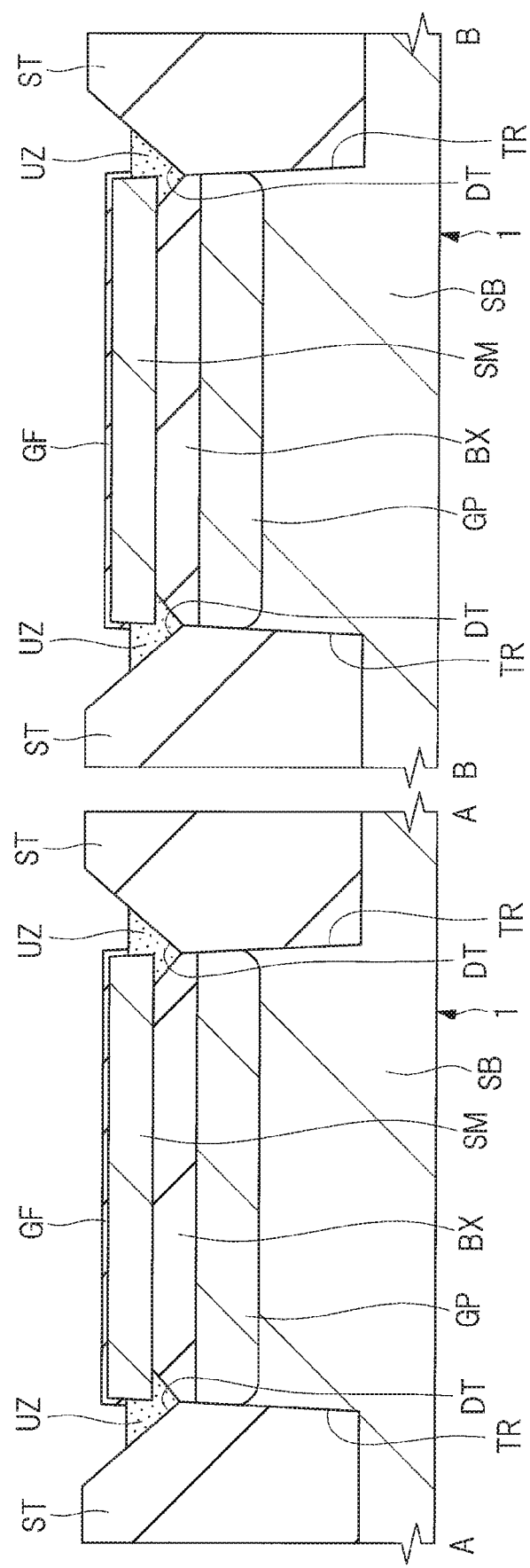
FIG. 12 is a cross-sectional view showing a principal part of the semiconductor device in the manufacturing process subsequent to FIG. 10.

First, after the surface of the semiconductor layer SM is cleaned by performing the cleaning process (wet etching process for cleaning) as needed, the gate insulating film GF is formed on the surface of the semiconductor layer SM as shown in FIG. 12. The gate insulating film GF is made of, for example, a silicon oxide film and can be formed by, for example, the thermal oxidation method. The gate insulating film GF is formed on the upper surface of the semiconductor layer SM, and is formed also on a part of the side surface of the semiconductor layer SM, which is not covered with the buried insulating film UZ.

Figure 13:
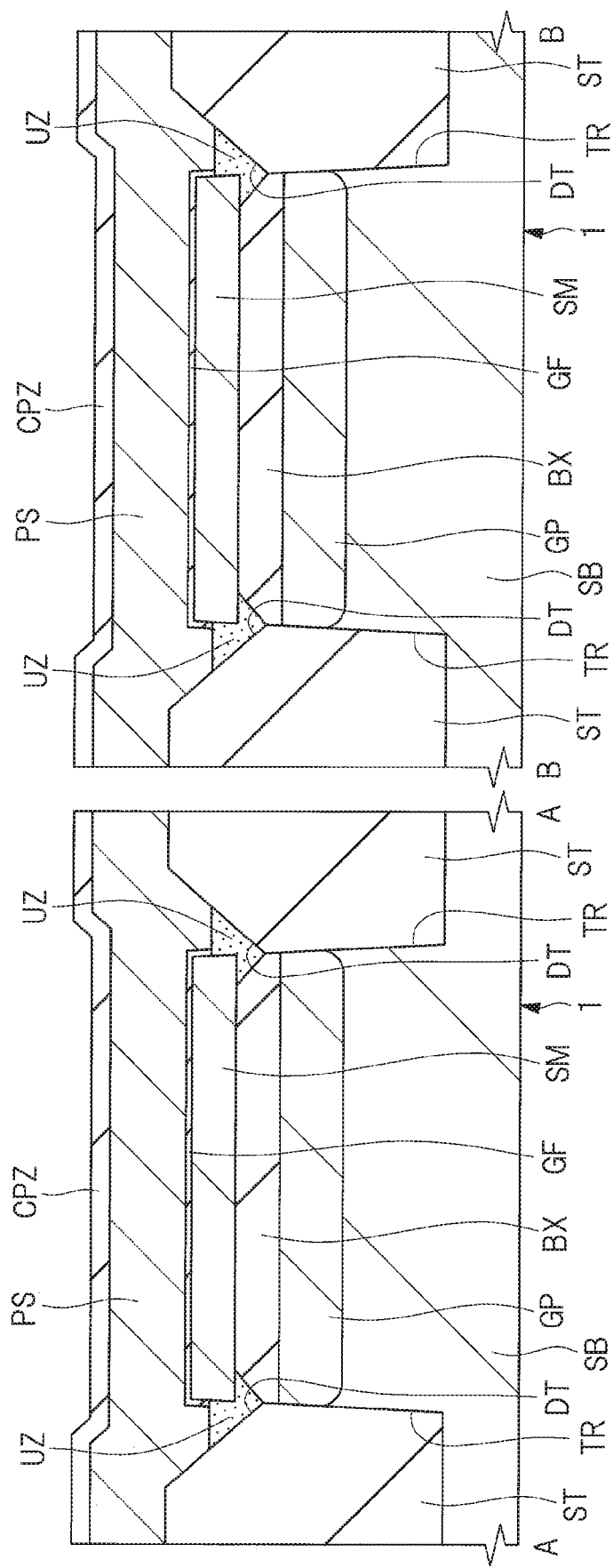
FIG. 13 is a cross-sectional view showing a principal part of the semiconductor device in the manufacturing process subsequent to FIG. 12.

Next, as shown in FIG. 13, the silicon film PS such as a doped polysilicon film is formed as a conductive film for forming the gate electrode over the main surface of the SOI substrate 1, that is, on the gate insulating film GF, the buried insulating film UZ, and the element isolation region ST, and then an insulating film CPZ such as a silicon nitride film is formed on the silicon film PS.

Figure 14:
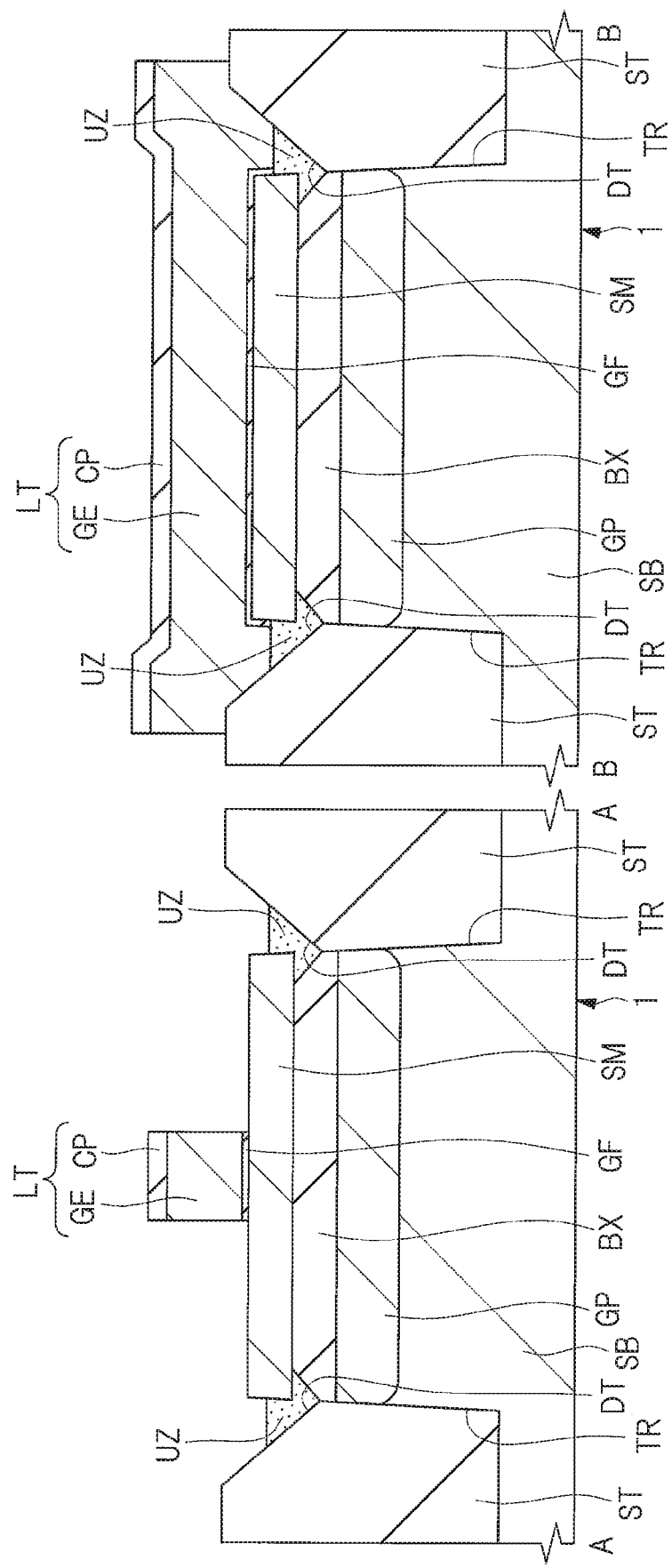
FIG. 14 is a cross-sectional view showing a principal part of the semiconductor device in the manufacturing process subsequent to FIG. 13.

Next, as shown in FIG. 14, the insulating film CPZ is patterned by the photolithography technique and the dry etching technique, and then the silicon film PS is patterned by the dry etching using the patterned insulating film CPZ as an etching mask. As shown in FIG. 14, the gate electrode GE is formed of the patterned silicon film PS.

Figure 15:
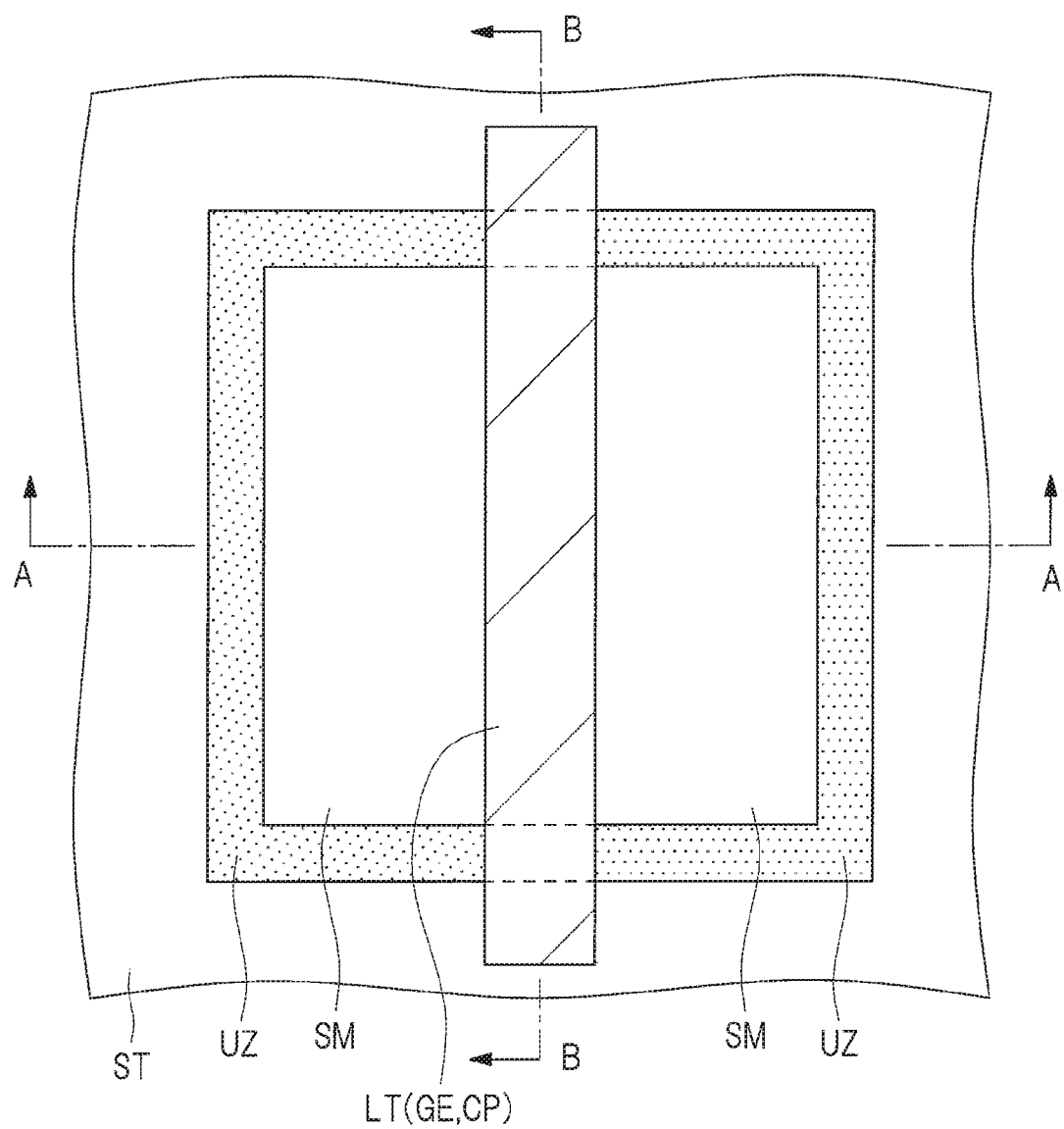
FIG. 15 is a plan view showing a principal part of the semiconductor device in the same manufacturing process as FIG. 14.

Note that FIG. 15 is a plan view showing a principal part of the semiconductor device in the same manufacturing process as FIG. 14. Namely, FIG. 14 and FIG. 15 show the state where the patterning process of the insulating film CPZ and the silicon film PS is finished, and the cross-sectional view at the position of the line A-A of FIG. 15 corresponds to the cross-sectional view (cross-sectional view A-A) on the left side of FIG. 14 and the cross-sectional view at the position of the line B-B of FIG. 15 corresponds to the cross-sectional view (cross-sectional view B-B) on the right side of FIG. 14. The line A-A shown in FIG. 15 is along the gate length direction of the gate electrode GE, and the line B-B shown in FIG. 15 is along the gate width direction of the gate electrode GE.

The gate electrode GE is formed on the semiconductor layer SM via the gate insulating film GF. However, both end parts of the gate electrode GE in the gate width direction are located on the element isolation region ST. Therefore, a part of the gate electrode GE is located on the buried insulating film UZ. Namely, most of the gate electrode GE is formed on the semiconductor layer SM via the gate insulating film GF, and both end parts of the gate electrode GE in the gate width direction and neighboring regions thereof are located on the element isolation region ST instead of on the semiconductor layer SM, and further, a part of the gate electrode GE between the part located on the semiconductor layer SM and the part located on the element isolation region ST is located on the buried insulating film UZ. Accordingly, the gate electrode GE includes the part formed on the semiconductor layer SM via the gate insulating film GF, the part located on the buried insulating film UZ, and the part located on the element isolation region ST. In the process of forming the gate insulating film GF (thermal oxidation process), the gate insulating film GF is formed on the surface of the semiconductor layer SM, but is not formed on the element isolation region ST and on the buried insulating film UZ. Therefore, the gate insulating film GF is interposed between the gate electrode GE and the semiconductor layer SM, but is not interposed between the gate electrode GE and the element isolation region ST and between the gate electrode GE and the buried insulating film UZ.

A cap insulating film CP made of the patterned insulating film CPZ is formed on the gate electrode GE. The cap insulating film CP has substantially the same planar shape as that of the gate electrode GE. A part of the gate insulating film GF which is not covered with the gate electrode GE can be removed by, for example, the dry etching for patterning the silicon film PS or the subsequent wet etching.

Here, a stacked structure of the gate electrode GE and the cap insulating film CP is hereinafter referred to as a stacked body LT.

Figure 16:
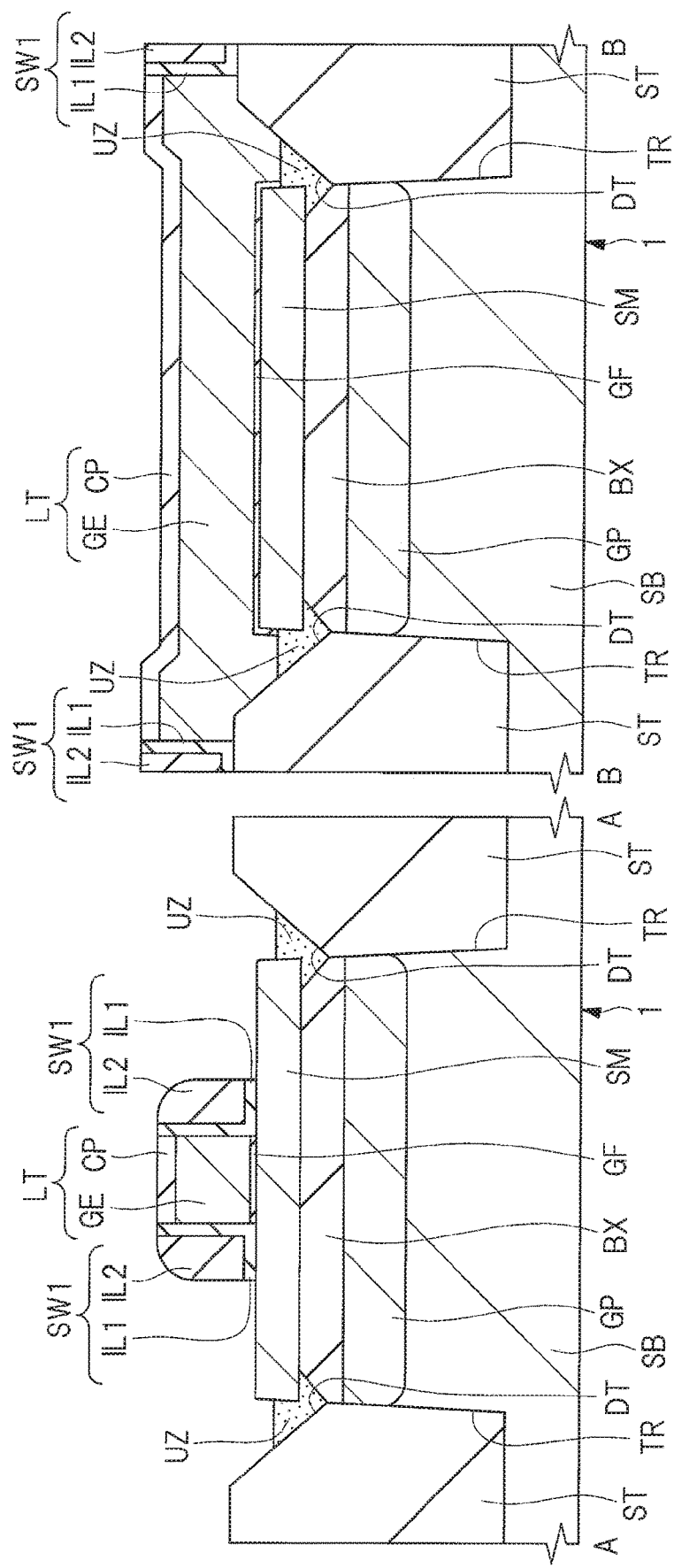
FIG. 16 is a cross-sectional view showing a principal part of the semiconductor device in the manufacturing process subsequent to FIG. 14.

Next, as shown in FIG. 16, a sidewall spacer SW1 is formed as a sidewall insulating film on the side surface of the stacked body LT.

The process of forming the sidewall spacer SW1 is performed in the following manner. That is, a stacked film including an insulating film IL1 and an insulating film IL2 on the insulating film IL1 is first formed over the entire main surface of the SOI substrate 1 including the upper surface of the element isolation region ST so as to cover the stacked body LT. The insulating film IL1 and the insulating film IL2 are made of different materials, and it is preferable that the insulating film IL1 is made of a silicon oxide film and the insulating film IL2 is made of a silicon nitride film. Then, the stacked film of the insulating film IL1 and the insulating film IL2 is etched-back by the anisotropic etching technique, thereby forming the sidewall spacer SW1 on both side surfaces of the stacked body LT. FIG. 16 shows this process. The sidewall spacer SW1 is made of the stacked film of the insulating film IL1 and the insulating film IL2. Specifically, the sidewall spacer SW1 is formed of the insulating film IL1 which continuously extends with substantially uniform thickness from the upper surface of the semiconductor layer SM to the side surface of the laminated body LT and the insulating film IL2 which is spaced apart from the semiconductor layer SM and the stacked body LT via the insulating film IL1.

Figure 17:
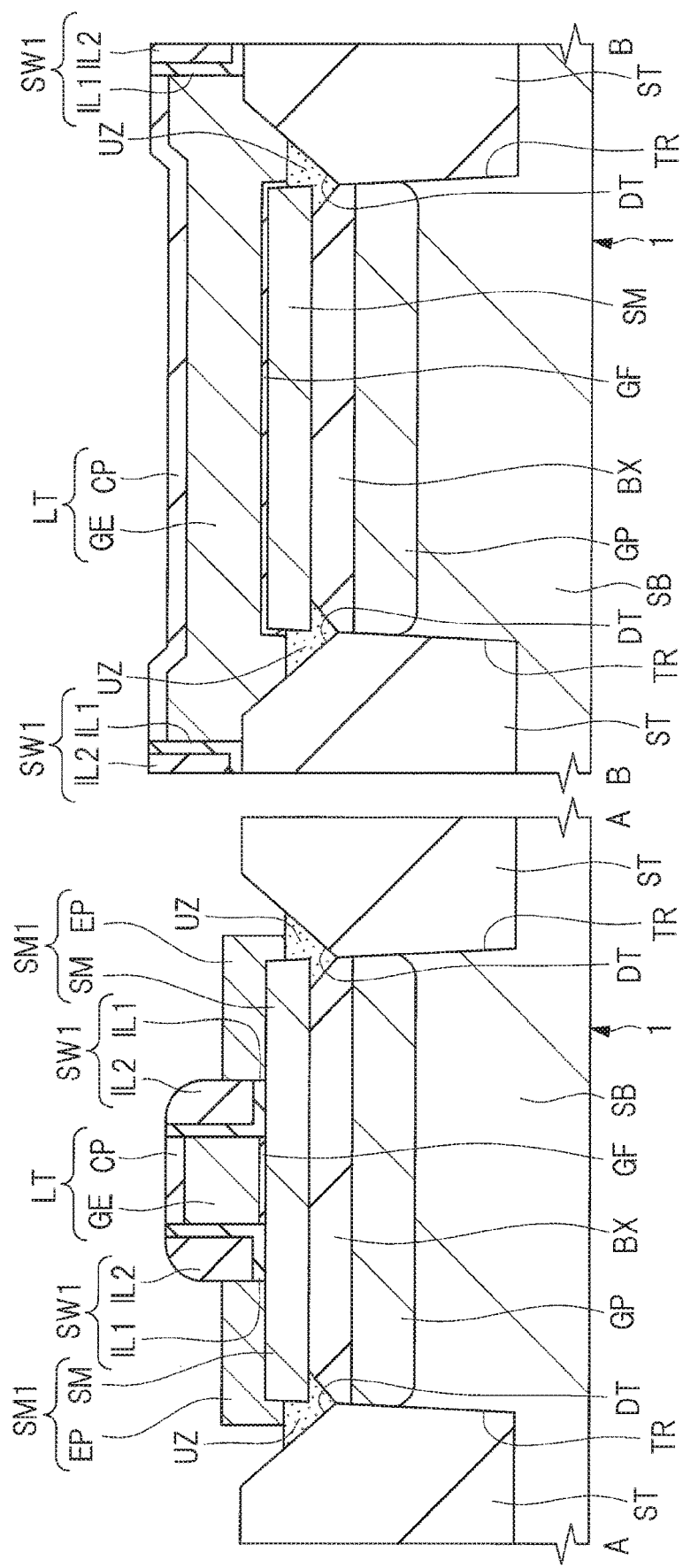
FIG. 17 is a cross-sectional view showing a principal part of the semiconductor device in the manufacturing process subsequent to FIG. 16.

Next, as shown in FIG. 17, a semiconductor layer EP is formed on the semiconductor layer SM of the SOI substrate 1 by the epitaxial growth. The semiconductor layer EP is an epitaxial layer formed by the epitaxial growth, and is made of, for example, single crystal silicon. Since the semiconductor layer EP is formed by the epitaxial growth, the crystalline structure of the semiconductor layer SM serving as a base substrate is reflected on the crystalline structure of the semiconductor layer EP, and the crystalline structure of the semiconductor layer EP is the same as that of the semiconductor layer SM.

Since the semiconductor layer EP is formed by the epitaxial growth, the epitaxial layer (semiconductor layer EP) is selectively grown on the exposed surface (Si surface) of the semiconductor layer SM, and the epitaxial layer is not grown on the insulating film. Therefore, the semiconductor layer EP is selectively grown on the surface (exposed surface) of the semiconductor layer SM in the region which is not covered with the stacked body LT and the sidewall spacer SW1. Accordingly, the semiconductor layer EP is formed on both sides of the structure composed of the stacked body LT and the sidewall spacer SW1 on the semiconductor layer SM. In addition, since the upper surface of the gate electrode GE is covered with the cap insulating film CP and the side surface of the gate electrode GE is covered with the sidewall spacer SW1, the epitaxial layer (semiconductor layer EP) is not formed on the gate electrode GE. In addition, since the element isolation region ST is made of an insulator (insulating film), the epitaxial layer (semiconductor layer EP) is not grown (not formed) on the element isolation region ST.

Further, since the buried insulating film UZ is made of an insulator (insulating film), the epitaxial layer (semiconductor layer EP) is not grown on the buried insulating film UZ. However, the buried insulating film UZ is adjacent to the semiconductor layer SM, and thus a part of the semiconductor layer EP grown on the semiconductor layer SM may be located on the buried insulating film UZ. Namely, although a part of the semiconductor layer EP is located on the buried insulating film UZ in some cases, the part of the semiconductor layer EP located on the buried insulating film UZ is not grown from the exposed surface of the buried insulating film UZ, but is grown from the exposed surface of the semiconductor layer SM.

For example, when the height position of the upper surface of the buried insulating film UZ is lower than the height position of the upper surface of the semiconductor layer SM, a part (upper part) of the side surface of the semiconductor layer SM is exposed without being covered with the buried insulating film UZ. In this case, the epitaxial layer (semiconductor layer EP) is grown not only from the upper surface of the semiconductor layer SM but also from the exposed part of the side surface of the semiconductor layer SM, and the part of the epitaxial layer (semiconductor layer EP) grown from the exposed part of the side surface of the semiconductor layer SM is located on the upper surface of the buried insulating film UZ (covers a part or all of the upper surface of the buried insulating film UZ).

Hereinafter, the combination of the semiconductor layer SM and the semiconductor layer EP is referred to as a semiconductor layer SM1.

Figure 18:
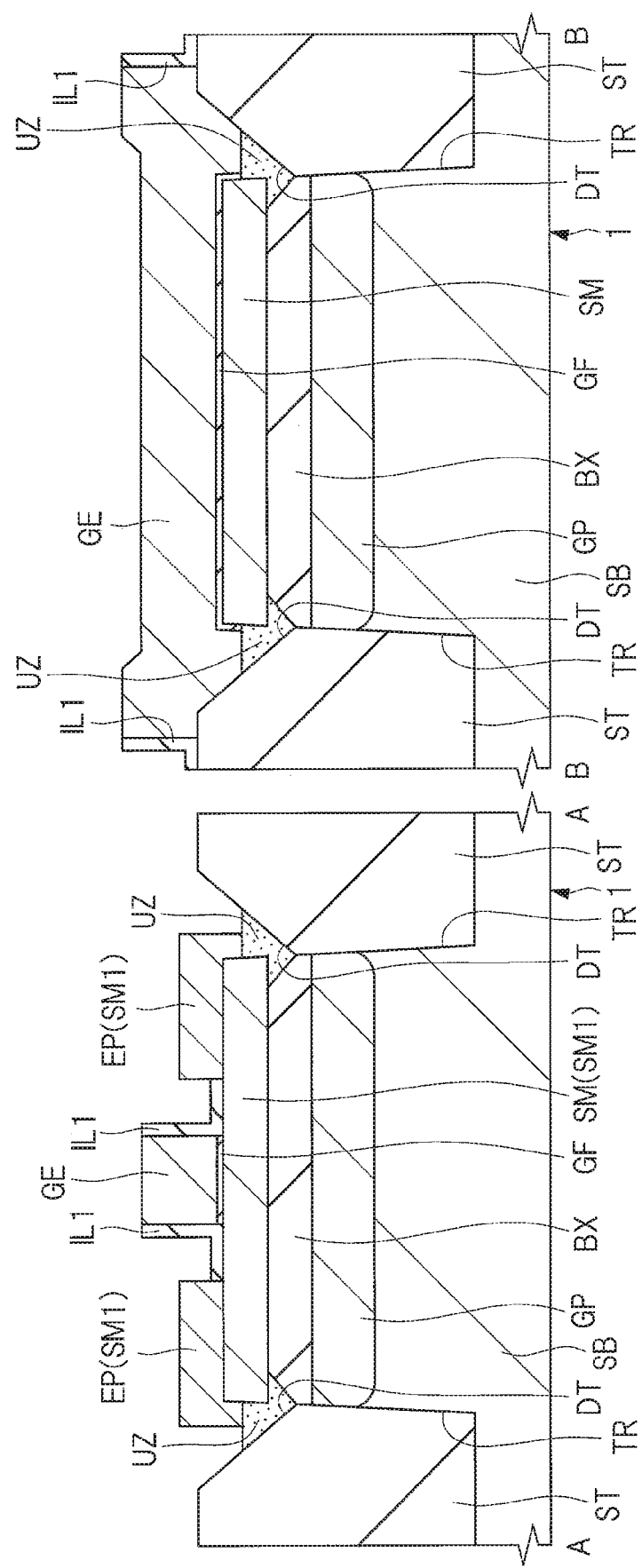
FIG. 18 is a cross-sectional view showing a principal part of the semiconductor device in the manufacturing process subsequent to FIG. 17.

Next, as shown in FIG. 18, the insulating film IL2 constituting the sidewall spacer SW1 is removed by etching. At this time, since the insulating film IL2 is removed by etching under the condition that the insulating film IL1 is hard to be etched compared with the insulating film IL2, the insulating film IL1 constituting the sidewall spacer SW1 is hardly etched and left. In addition, since the insulating film IL2 is made of the same material as that of the cap insulating film CP, the cap insulating film CP can also be removed by this etching. The removal of the cap insulating film CP makes it possible to form a metal silicide layer SL to be described later on the gate electrode GE.

Figure 19:
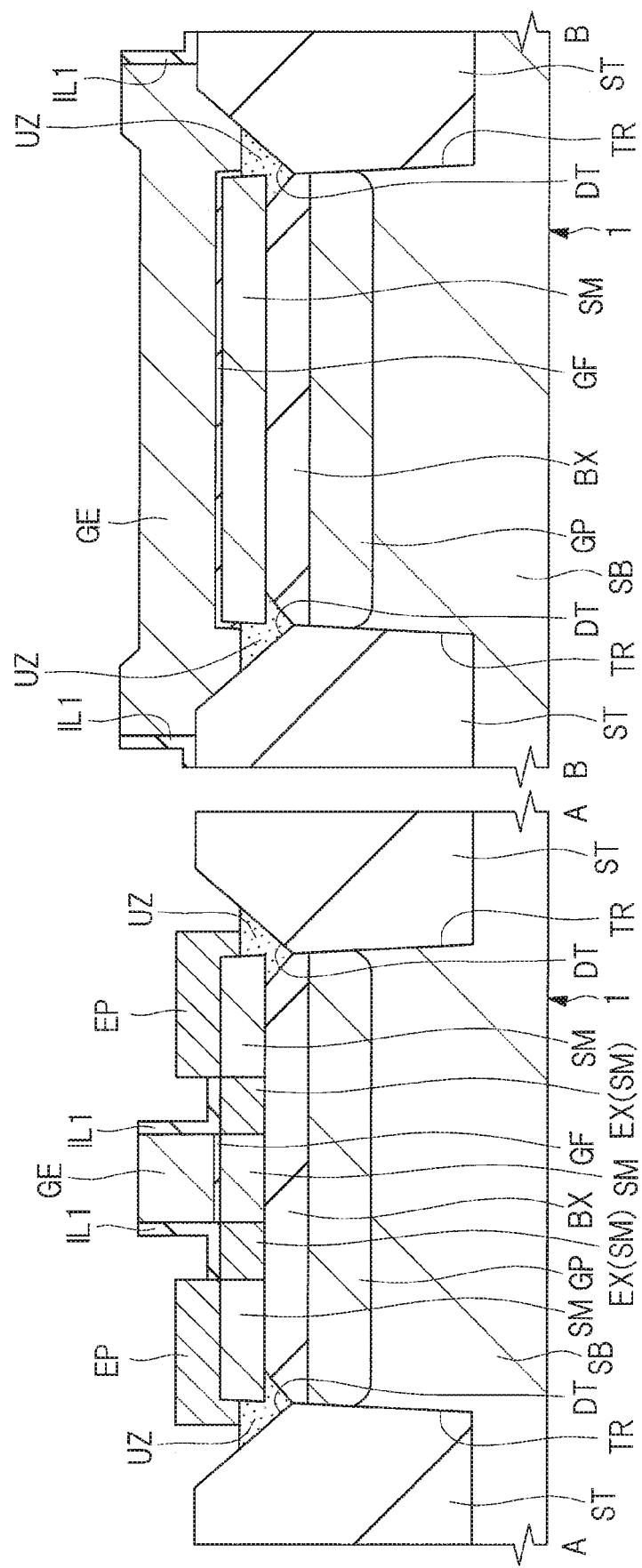
FIG. 19 is a cross-sectional view showing a principal part of the semiconductor device in the manufacturing process subsequent to FIG. 18.

Next, as shown in FIG. 19, n type semiconductor regions (extension regions) EX are formed by ion-implanting an n type impurity such as phosphorus (P) or arsenic (As) into the semiconductor layer SM1 (semiconductor layer SM and semiconductor layer EP) of the SOI substrate 1 in the regions on both sides of the gate electrode GE. In the ion implantation for forming the n type semiconductor regions EX, the gate electrode GE and a part of the insulating film IL1 extending on the side surface of the gate electrode GE can function as an ion implantation blocking mask.

Note that hatching is applied to the region of the semiconductor layer SM1 (semiconductor layer SM and semiconductor layer EP) into which impurity ions are implanted by the ion implantation for forming the n type semiconductor regions EX, but no hatching is applied to the region into which impurity ions are not implanted in FIG. 19 for easier understanding.

Figure 20:
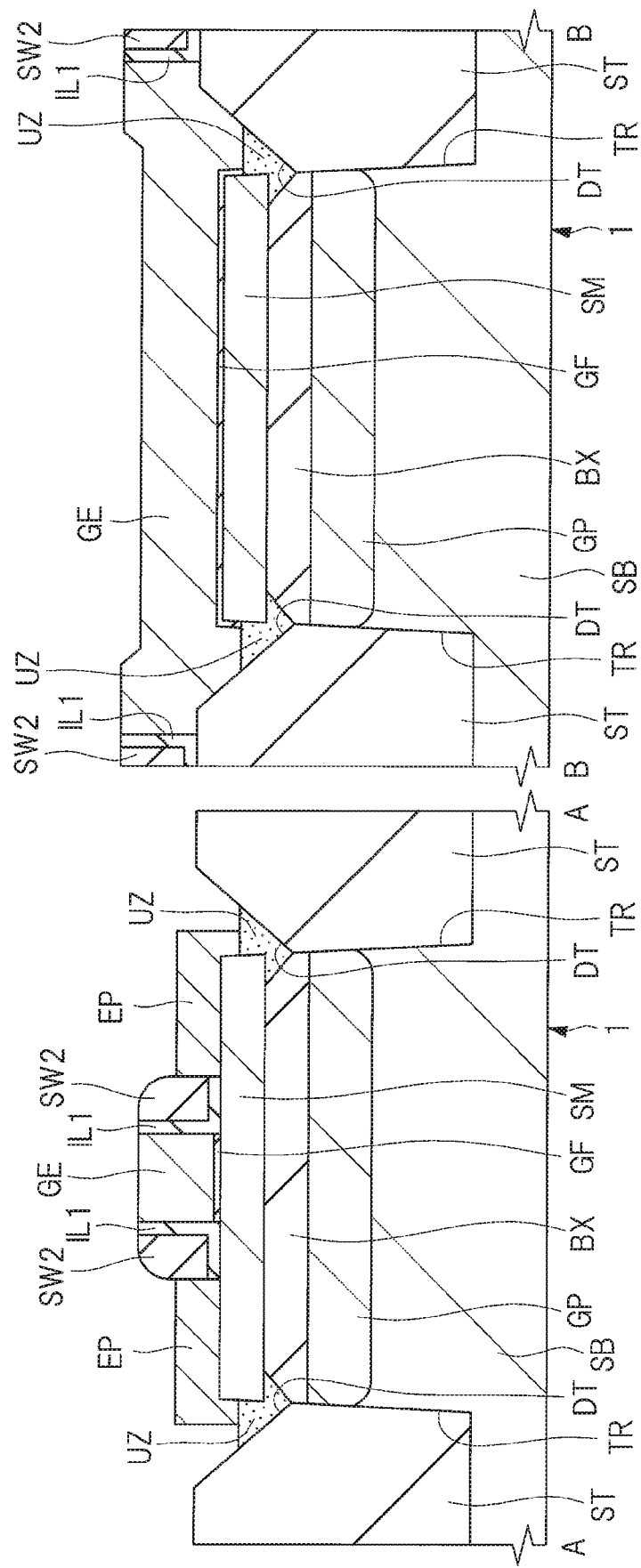
FIG. 20 is a cross-sectional view showing a principal part of the semiconductor device in the manufacturing process subsequent to FIG. 19.

Next, as shown in FIG. 20, a sidewall spacer SW2 is formed as a sidewall insulating film on the side surface of the gate electrode GE.

The process of forming the sidewall spacer SW2 is performed in the following manner. That is, after an insulating film (for example, silicon nitride film) for forming the sidewall spacer SW2 is formed over the entire main surface of the SOI substrate 1 including the upper surface of the element isolation region ST so as to cover the gate electrode GE and the insulating film IL1, this insulating film is etched back by the anisotropic etching technique, thereby forming the sidewall spacer SW2 on the side surface of the gate electrode GE. The sidewall spacer SW2 is formed on both side surfaces of the gate electrode GE via the insulating film ILL Note that the hatching indicating the n type semiconductor region EX is not applied in FIG. 20 for making the drawing easy to see.

Figure 21:
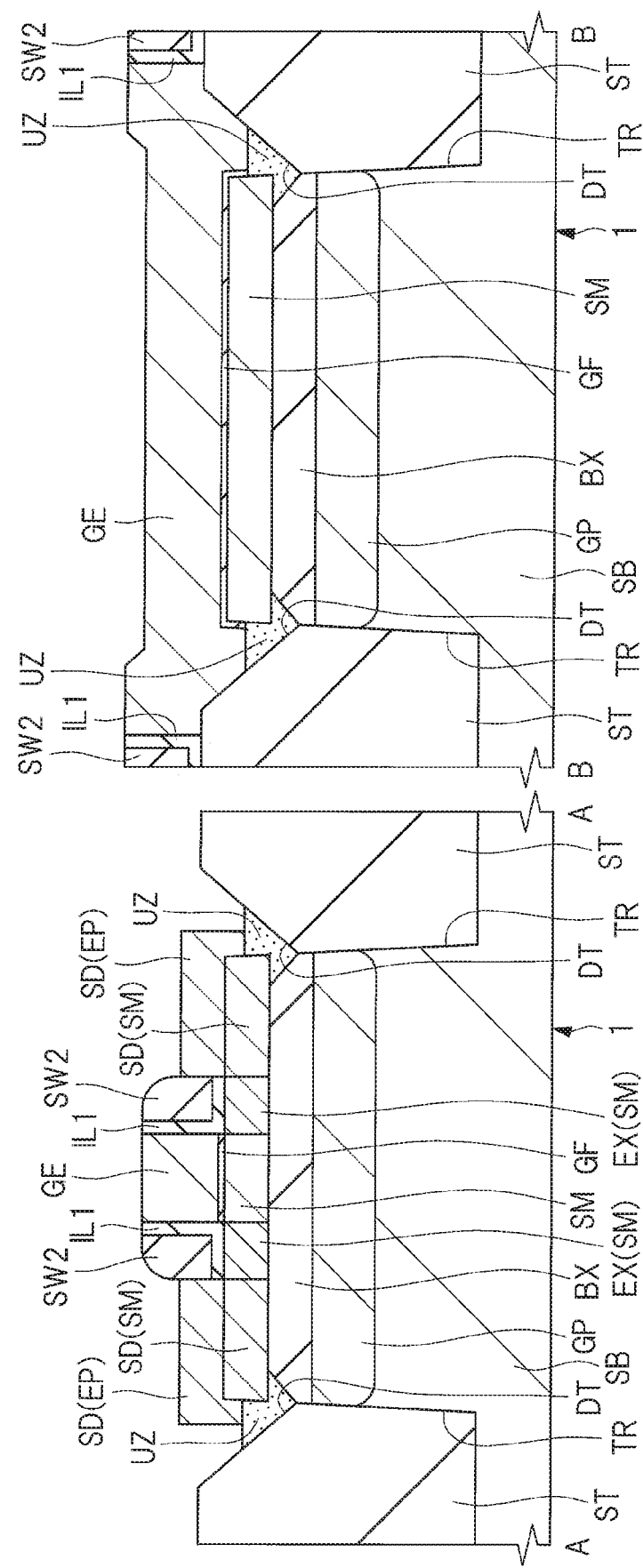
FIG. 21 is a cross-sectional view showing a principal part of the semiconductor device in the manufacturing process subsequent to FIG. 20.

Next, as shown in FIG. 21, $n^+$ type semiconductor regions (source/drain regions) SD are formed by ion-implanting an n type impurity such as phosphorus (P) or arsenic (As) into the semiconductor layer SM1 (semiconductor layer SM and semiconductor layer EP) of the SOI substrate 1 in the regions on both sides of the gate electrode GE and the sidewall spacer SW2. In the ion implantation for forming the $n^+$ type semiconductor regions SD, the gate electrode GE and the sidewall spacers on both sides thereof can function as an ion implantation blocking mask. The $n^+$ type semiconductor region SD has an impurity concentration higher than that of then type semiconductor region EX.

The $n^-$ type semiconductor region EX is formed in the semiconductor layer SM1 (semiconductor layer SM and semiconductor layer EP) so as to be adjacent to a channel formation region, and the $n^+$ type semiconductor region SD is formed in the semiconductor layer SM1 (semiconductor layer SM and semiconductor layer EP) so as to be spaced apart from the channel formation region by the size of the $n^-$ type semiconductor region EX and located at the position adjacent to the $n^-$ type semiconductor region EX. Note that the n type semiconductor region EX is formed in the semiconductor layer SM, and the $n^+$ type semiconductor region SD is formed across the semiconductor layer SM and the semiconductor layer EP. Namely, the $n^-$ type semiconductor region EX is formed in a part of the semiconductor layer SM located below the insulating film IL1 and the sidewall spacer SW2, and the $n^+$ type semiconductor region SD is formed across the semiconductor layer EP and the semiconductor layer SM below the semiconductor layer EP. Apart of the semiconductor layer SM located below the gate electrode GE serves as the channel formation region in which the channel of the MISFET is formed.

Next, activation annealing which is the heat treatment for activating the impurity introduced into the $n^+$ type semiconductor region SD and the n type semiconductor region EX is performed. When the ion implantation region has been amorphized, the region can be crystallized in this activation annealing.

Figure 22:
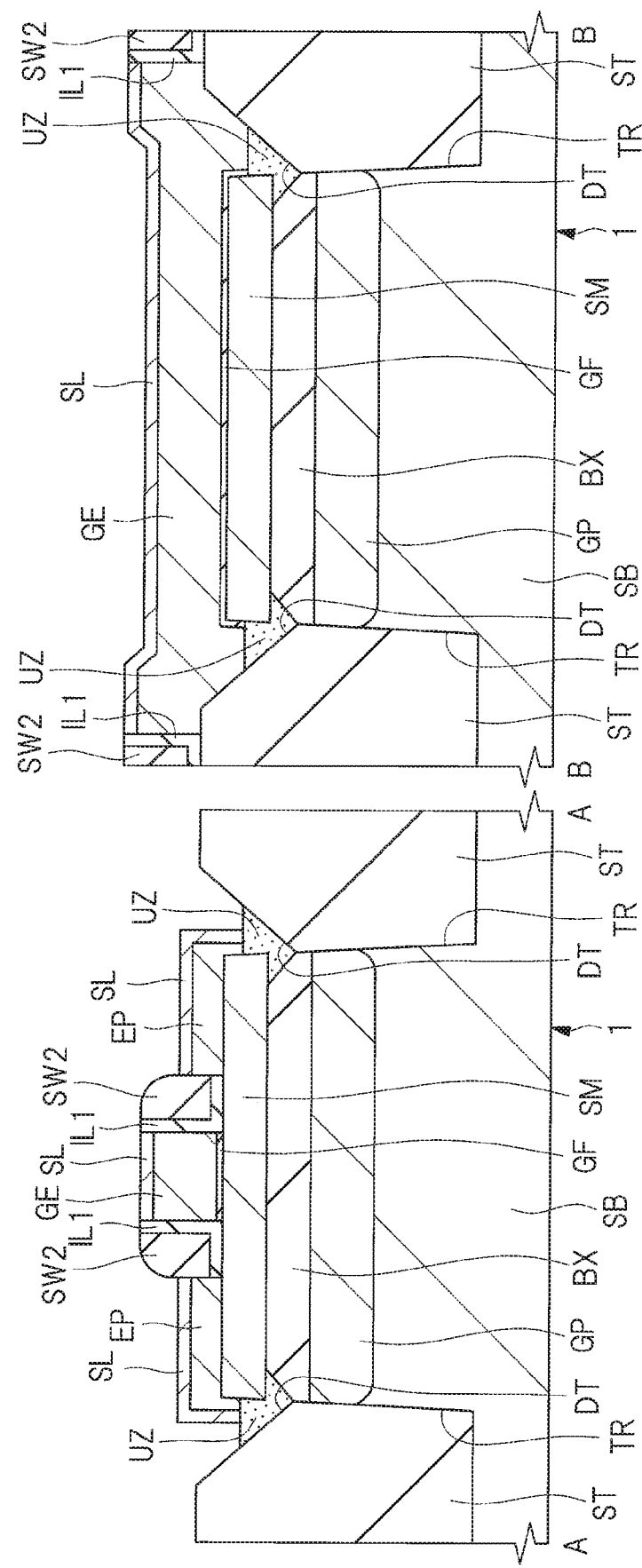
FIG. 22 is a cross-sectional view showing a principal part of the semiconductor device in the manufacturing process subsequent to FIG. 21.

Next, as shown in FIG. 22, the metal silicide layer SL with low resistance is formed on each upper part (surface part) of the $n^+$ type semiconductor region SD and the gate electrode GE by the salicide (Self Aligned Silicide) technique.

The metal silicide layer SL can be formed in the following manner. That is, a metal film for forming the metal silicide layer SL is formed over the entire main surface of the SOI substrate 1 including the upper surface of the element isolation region ST so as to cover the gate electrode GE, the sidewall spacer SW2, the semiconductor layer EP and the buried insulating film UZ. This metal film is made of, for example, a cobalt film, a nickel film or a nickel platinum alloy film. Then, the SOI substrate 1 is subjected to heat treatment, so that each upper part of the $n^+$ type semiconductor region SD and the gate electrode GE is reacted with the metal film. Consequently, the metal silicide layer SL is formed on each upper part of the $n^+$ type semiconductor region SD and the gate electrode GE. Thereafter, the unreacted metal film is removed. FIG. 22 shows the cross-sectional view at this stage. Since the metal silicide layer SL is formed, the diffusion resistance and the contact resistance of the gate electrode GE and the $n^+$ type semiconductor region SD can be reduced.

In the manner described above, a semiconductor element such as the MISFET (transistor) can be formed.

Figure 23:
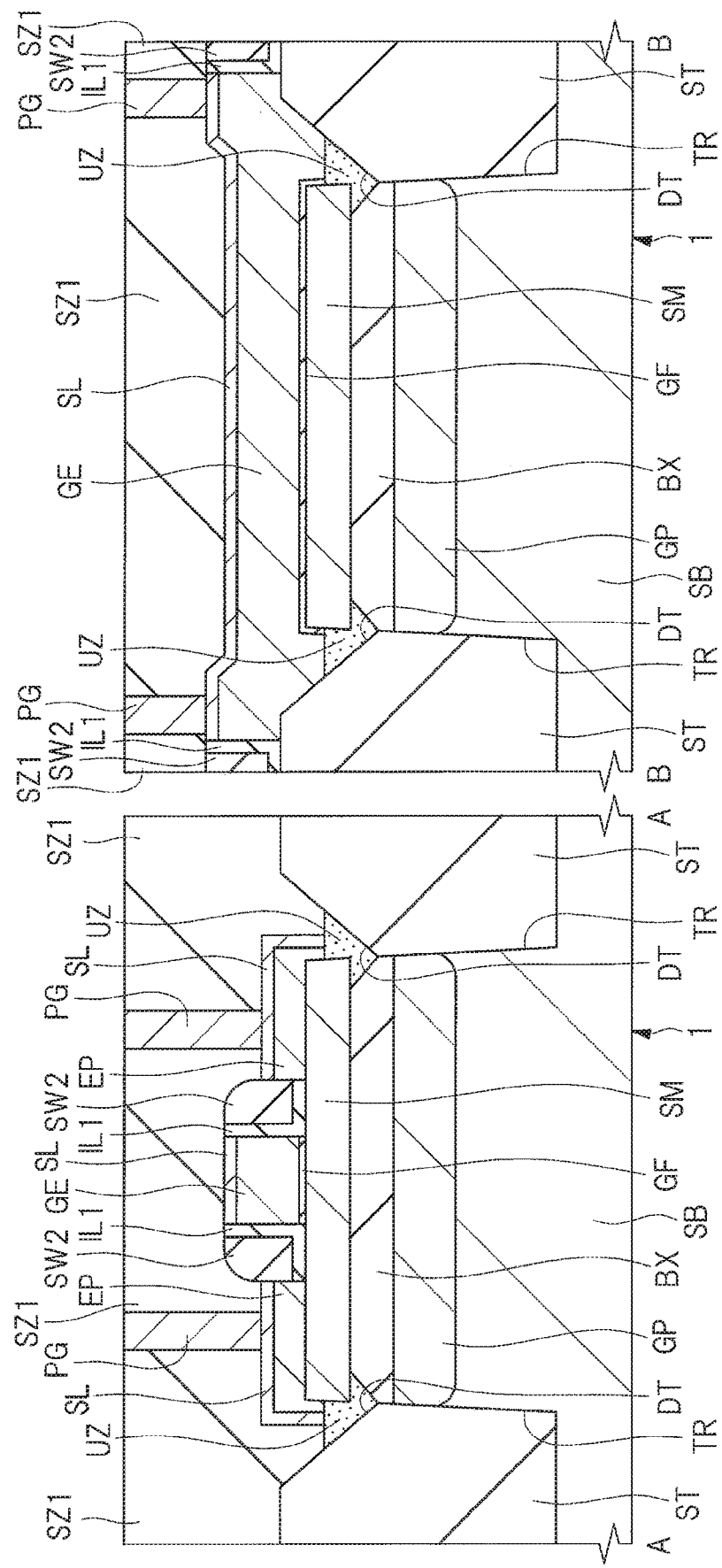
FIG. 23 is a cross-sectional view showing a principal part of the semiconductor device in the manufacturing process subsequent to FIG. 22.

Next, as shown in FIG. 23, an insulating film SZ1 as an interlayer insulating film is formed over the entire main surface of the SOI substrate 1 including the upper surface of the element isolation region ST so as to cover the gate electrode GE, the sidewall spacer SW2, the semiconductor layer EP, the metal silicide layer SL and the buried insulating film UZ. A single film of a silicon oxide film or a stacked film of a silicon nitride film and a thick silicon oxide film on the silicon nitride film can be used as the insulating film SZ1. After the insulating film SZ1 is formed, the upper surface of the insulating film SZ1 may be polished by the CMP method as needed.

Next, the insulating film SZ1 is dry-etched with using a photoresist pattern (not shown) formed on the insulating film SZ1 by the photolithography technique as an etching mask, thereby forming a contact hole (through hole) in the insulating film SZ1. Then, a conductive plug PG made of, for example, tungsten (W) is formed in the contact hole. For example, the plug PG can be formed by sequentially forming a barrier conductor film and a tungsten film on the insulating film SZ1 including the inside of the contact hole and then removing unnecessary main conductor film and barrier conductor film outside the contact hole by the CMP method or the etch-back method. The plug PG is electrically connected to the metal silicide layer SL on the $n^+$ type semiconductor region SD or the metal silicide layer SL on the gate electrode GE.

Figure 24:
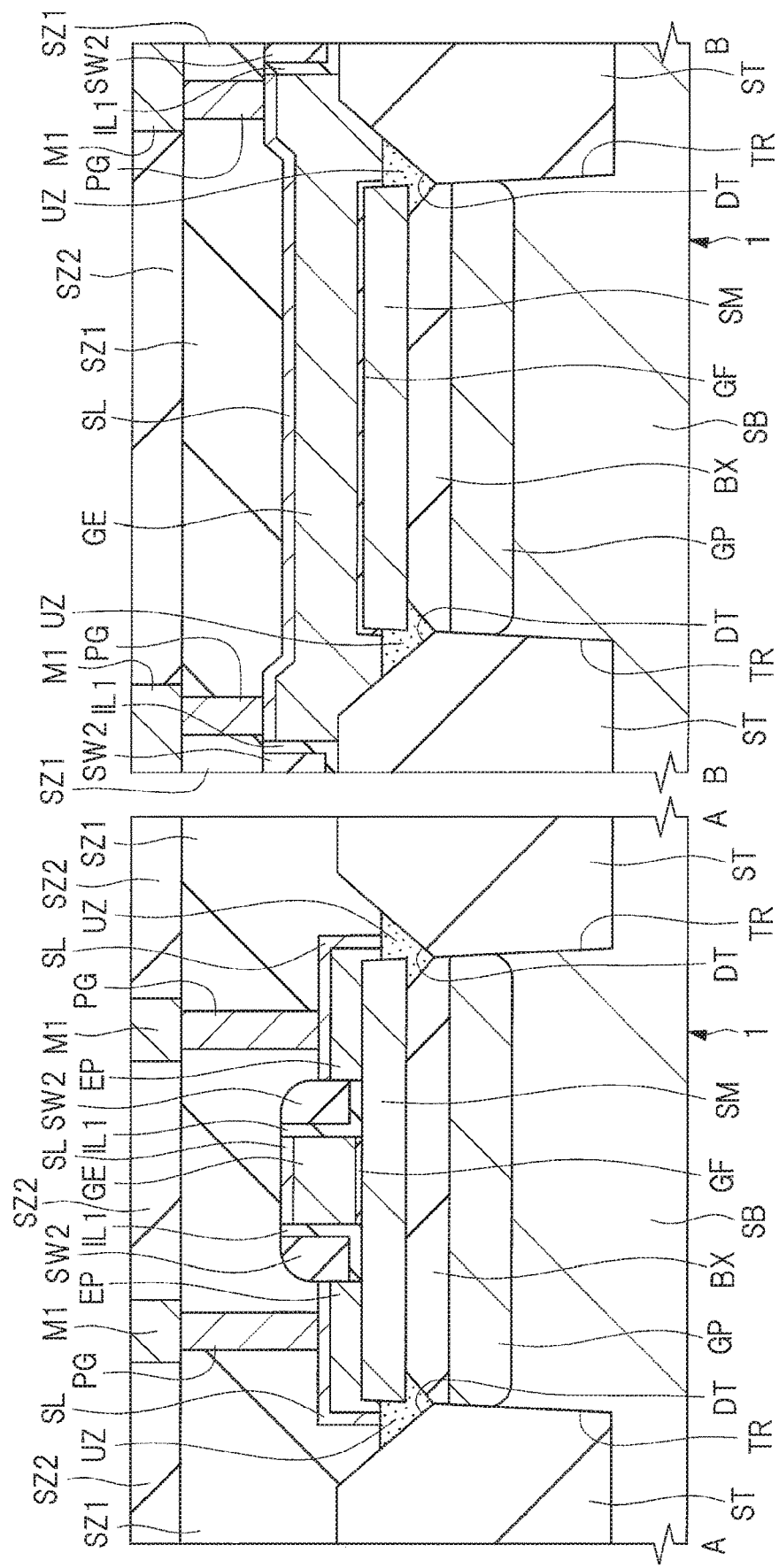
FIG. 24 is a cross-sectional view showing a principal part of the semiconductor device in the manufacturing process subsequent to FIG. 23.

Next, as shown in FIG. 24, after an insulating film SZ2 is formed on the insulating film SZ1 in which the plug PG has been buried and a wiring trench is formed in a predetermined region of the insulating film SZ2, a wiring M1 is buried in the wiring trench by the single damascene method. The wiring M1 is, for example, a copper wiring (buried copper wiring) composed mainly of copper. The wiring M1 is electrically connected to the $n^+$ type semiconductor region SD or the gate electrode GE via the plug PG.

Then, wirings in second and subsequent layers are formed by the damascene method or the like, but the illustration and description thereof are omitted here. Also, the wiring M1 and the wirings in the upper layers thereof can be formed by the method other than the damascene method, for example, by the method of patterning a conductor film for wiring, and a tungsten wiring or an aluminum wiring may be formed other than the copper wiring.

In the manner described above, the semiconductor device according to the present embodiment is manufactured.

Also, in the present embodiment, the case where the n channel MISFET is formed as a MISFET has been described, but it is also possible to form a p channel MISFET by reversing the conductivity type.

<Structure of Semiconductor Device>

The structure of the semiconductor device according to the present embodiment manufactured in the above-described manner will be described.

Figure 25:
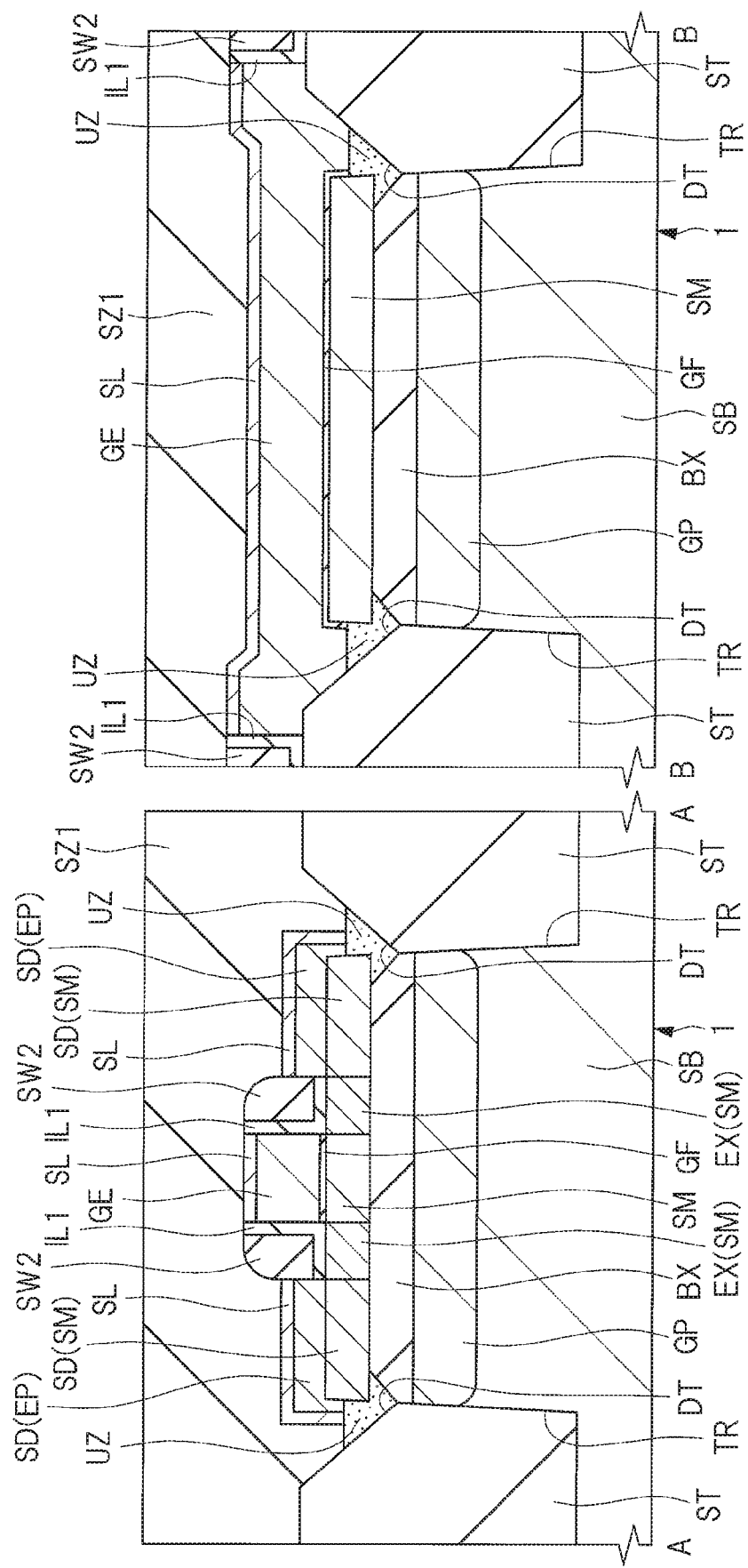
FIG. 25 is a cross-sectional view showing a principal part of the semiconductor device according to the embodiment.

FIG. 25 is a cross-sectional view showing a principal part of the semiconductor device according to the present embodiment and corresponds to FIG. 24 mentioned above. However, illustrations of the plug PG, the insulating film SZ2 and the wiring M1 are omitted in FIG. 25 for the simplification of the drawing.

As shown in FIG. 25, the semiconductor device of the present embodiment is the semiconductor device using the SOI substrate 1 and is also the semiconductor device provided with the MISFET.

As described above, the SOI substrate 1 includes the semiconductor substrate SB serving as a support substrate, the insulating layer BX formed over the semiconductor substrate SB, and the semiconductor layer SM formed over the insulating layer BX.

The element isolation region ST is formed in the SOI substrate 1. The element isolation region ST is formed of the insulating film ZM3 buried in the trench TR for element isolation as described above. The element isolation region ST penetrates the semiconductor layer SM and the insulating layer BX, and the bottom part thereof reaches the semiconductor substrate SB and the lower part of the element isolation region ST is located inside the semiconductor substrate SB. Therefore, a part of the element isolation region ST is located below the lower surface of the insulating layer BX. In the active region defined (surrounded planarly) by the element isolation region ST in the SOI substrate 1, the insulating layer BX and the semiconductor layer SM are stacked on the semiconductor substrate SB in this order from below.

The gate electrode GE is formed on the semiconductor layer SM in the active region defined (surrounded planarly) by the element isolation region ST via the gate insulating film GF. A part of the semiconductor layer SM located below the gate electrode GE functions as the region in which the channel of the MISFET is formed (channel formation region).

The sidewall spacer SW2 is formed on the sidewall of the gate electrode GE via the insulating film IL1. The sidewall spacer SW2 is made of an insulating film, and can be regarded as a sidewall insulating film.

The sidewall spacer SW2 is not in contact with the gate electrode GE, and the insulating film IL1 is interposed between the sidewall spacer SW2 and the sidewall of the gate electrode GE. In addition, the sidewall spacer SW2 is not in contact with the semiconductor layer SM, and the insulating film IL1 is interposed between the sidewall spacer SW2 and the semiconductor layer SM. Also, the entire combination of the insulating film IL1 and the sidewall spacer SW2 may be regarded as the sidewall spacer or the sidewall insulating film.

The semiconductor layer EP which is an epitaxial layer (epitaxial semiconductor layer) is formed on the semiconductor layer SM. Namely, the semiconductor layer EP is selectively formed on the semiconductor layer SM in the region which is not covered with the gate electrode GE and the insulating film IL1. The semiconductor layer EP is formed on both sides of the gate electrode GE (both sides in the gate length direction).

The semiconductor regions for source and drain of the MISFET are formed in the semiconductor layers SM and EP on both sides of the gate electrode GE (both sides in the gate length direction), and each of the semiconductor regions for source and drain of the MISFET is formed of the n type semiconductor region EX and the n$^+$ type semiconductor region SD whose impurity concentration is higher than that of the n type semiconductor region EX. Namely, in the stacked structure of the semiconductor layer SM and the semiconductor layer EP, (a pair of) the n type semiconductor regions EX are formed in the regions spaced apart from each other with the channel formation region interposed therebetween, and (a pair of) the n$^+$ type semiconductor regions SD are formed on an outer side of the n$^-$ type semiconductor regions EX (on the side separated from the channel formation region). Since the semiconductor regions for source and drain each include the n$^-$ type semiconductor region EX and the n$^+$ type semiconductor region SD whose impurity concentration is higher than that of the n type semiconductor region EX, the LDD (Lightly Doped Drain) structure is provided. The n$^-$ type semiconductor region EX is mainly formed in a part of the semiconductor layer SM located below the insulating film IL1 and the sidewall spacer SW2, and the n$^+$ type semiconductor region SD is mainly formed across the semiconductor layer EP and the semiconductor layer SM.

Since the semiconductor regions for source and drain (corresponding to the n$^+$ type semiconductor regions SD in this case) are formed in the semiconductor layer EP, the semiconductor layer EP can be regarded as the semiconductor layer (epitaxial semiconductor layer) for source and drain (for forming source and drain).

The metal silicide layer SL which is a reaction layer (compound layer) between metal and the semiconductor layer EP (n$^+$ type semiconductor region SD) is formed on the upper part (surface part) of the semiconductor layer EP, that is, on the upper part (surface part) of the n$^+$ type semiconductor region SD. When the gate electrode GE is made of a silicon film, the metal silicide layer SL is formed also on the upper part of the gate electrode GE.

As described above, the divot (concave part, hollow part) DT is formed in the element isolation region ST at the position (region) adjacent to the semiconductor layer SM in plan view, and the buried insulating film UZ is formed in the divot DT. Therefore, the buried insulating film UZ that fills the divot DT is also formed at the position (region) adjacent to the semiconductor layer SM in plan view. Since the divot DT is formed so as to surround the semiconductor layer SM in plan view, the buried insulating film UZ that fills the divot DT is also formed so as to surround the semiconductor layer SM in plan view (see FIG. 11 and FIG. 15).

The gate electrode GE is mainly formed on the semiconductor layer SM via the gate insulating film GF, and both end parts of the gate electrode GE in the gate width direction are located on the element isolation region ST. Also, the gate insulating film GF and the gate electrode GE are formed after forming the buried insulating film UZ. Accordingly, the gate electrode GE includes a part formed on the semiconductor layer SM via the gate insulating film, a part located on the buried insulating film UZ and a part located on the element isolation region ST. In reflection of the fact that the insulating layer BX is side-etched when the divot DT is formed, at least a part of the buried insulating film UZ is located below the semiconductor layer SM.

The insulating film SZ1 as an interlayer insulating film is formed over the main surface of the SOI substrate 1 including the upper surface of the element isolation region ST so as to cover the gate electrode GE, the sidewall spacer SW2, the semiconductor layer EP, the metal silicide layer SL and the buried insulating film UZ. The above-described contact hole is formed in the insulating film SZ1 and the above-described plug PG is formed in the contact hole, but the illustrations thereof are omitted here. In addition, the above-described insulating film SZ2 and the above-described wiring M1 are formed on the insulating film SZ1, but the illustrations thereof are omitted here.

<Study Example>

The example studied by the inventor of the present invention (study example) will be described with reference to FIG. 26 to FIG. 30. FIG. 26 to FIG. 30 are cross-sectional views each showing a principal part of a semiconductor device in a manufacturing process according to the study example.

The process up to obtaining the structure shown in FIG. 8 is almost the same in both the manufacturing process of the semiconductor device of the study example and the manufacturing process of the semiconductor device of the present embodiment, and thus the description thereof is omitted here.

In the case of the study example, after the structure of FIG. 8 has been obtained, the process of forming the gate insulating film and the process of forming the gate electrode are performed without performing the process of FIG. 9 to FIG. 11 (process of forming the buried insulating film UZ).

Figure 26:
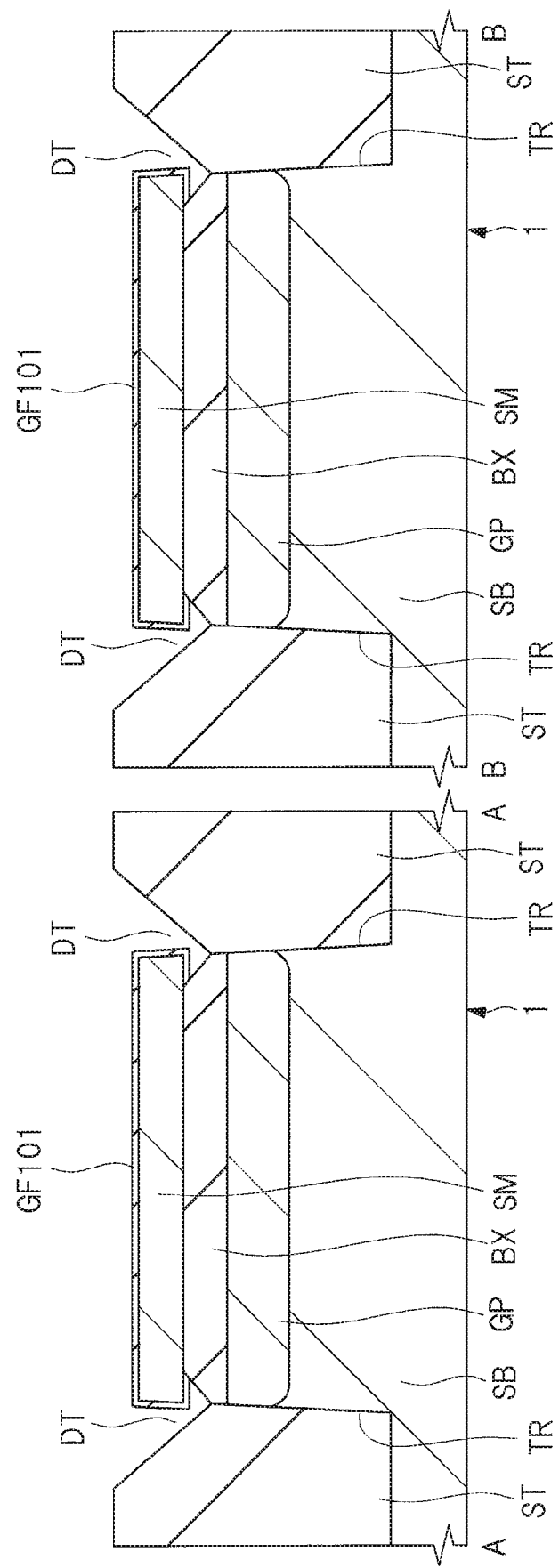
FIG. 26 is a cross-sectional view showing a principal part of a semiconductor device in a manufacturing process according to a study example.

Namely, in this study example, after the structure of FIG. 8 has been obtained, a gate insulating film GF101 is formed by the thermal oxidation method or the like on the surface of the semiconductor layer SM as shown in FIG. 26 without forming the above-described insulating film ZM4. The gate insulating film GF101 may be formed not only on the upper surface of the semiconductor layer SM but also on the side surface and the lower surface of the semiconductor layer SM exposed from the divot DT.

Figure 27:
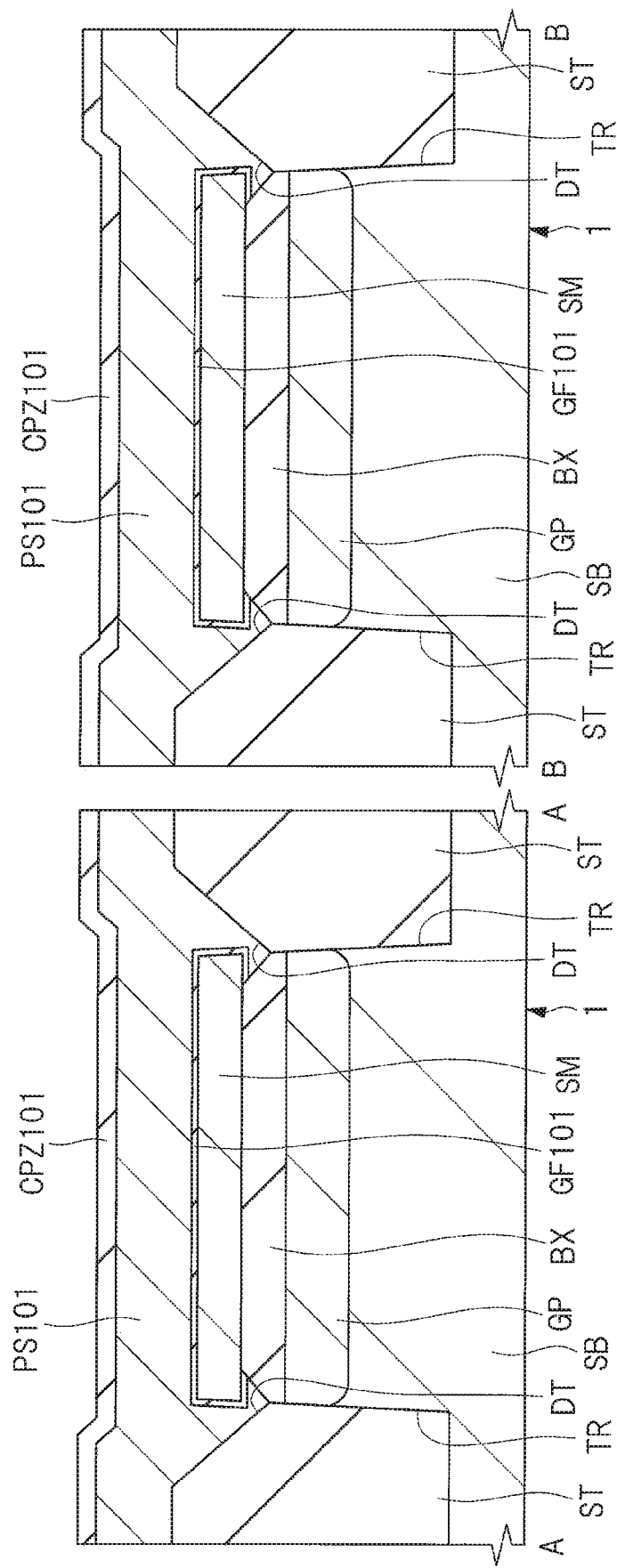
FIG. 27 is a cross-sectional view showing a principal part of the semiconductor device in the manufacturing process subsequent to FIG. 26.

Next, as shown in FIG. 27, a silicon film PS101 such as a doped polysilicon film is formed over the main surface of the SOI substrate 1, that is, on the gate insulating film GF101 and the element isolation region ST, and then an insulating film CPZ101 such as a silicon nitride film is formed on the silicon film PS101. Since the buried insulating film UZ is not formed in the study example, the silicon film PS101 is formed on the gate insulating film GF101 and the element isolation region ST so as to fill the divot DT.

Figure 28:
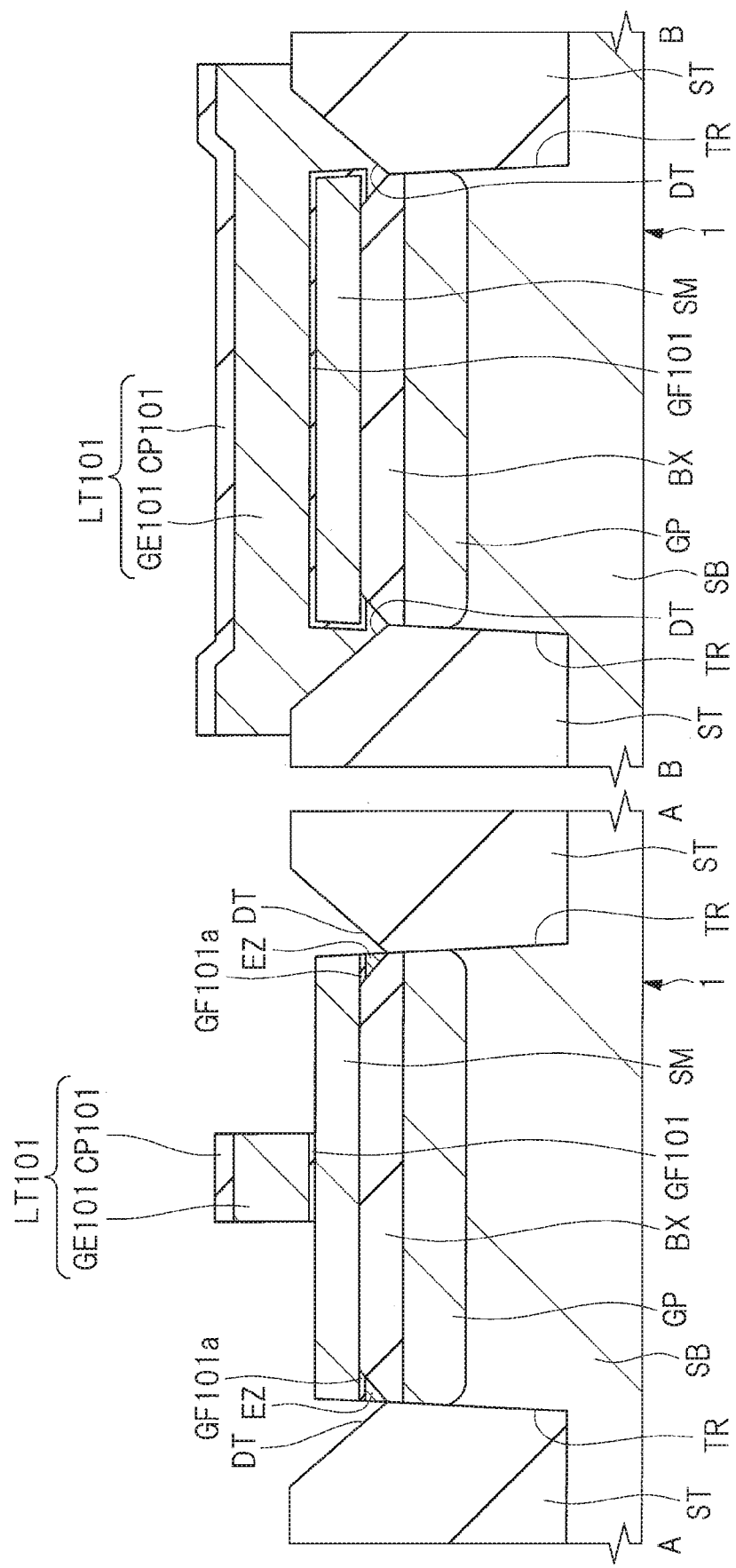
FIG. 28 is a cross-sectional view showing a principal part of the semiconductor device in the manufacturing process subsequent to FIG. 27.

Next, as shown in FIG. 28, the insulating film CPZ101 is patterned by the photolithography technique and the dry etching technique, and then the silicon film PS101 is patterned by the dry etching using the patterned insulating film CPZ101 as an etching mask, thereby forming a stacked body LT101 of a gate electrode GE101 and a cap insulating film CP101. The gate electrode GE101 is formed of the patterned silicon film PS101, and the cap insulating film CP101 is formed of the patterned insulating film CPZ101. The gate electrode GE101 is formed on the semiconductor layer SM via the gate insulating film GF101, but both end parts of the gate electrode GE101 in the gate width direction are located on the element isolation region ST.

Figure 29:
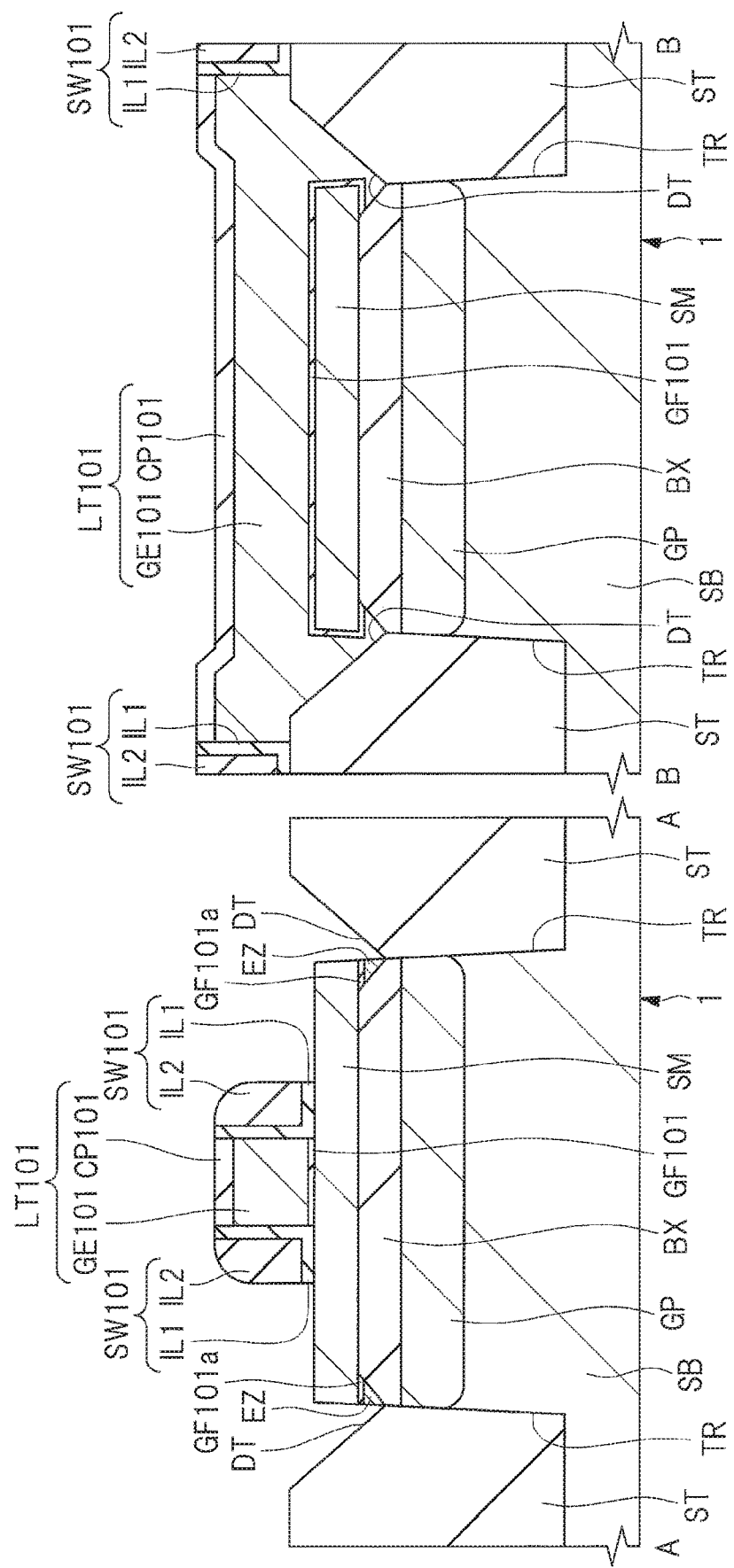
FIG. 29 is a cross-sectional view showing a principal part of the semiconductor device in the manufacturing process subsequent to FIG. 28.

Next, as shown in FIG. 29, a sidewall spacer SW101 is formed on the side surface of the stacked body LT101. The method of forming the sidewall spacer SW101 is almost the same as the method of forming the sidewall spacer SW1, and thus the description thereof is omitted here.

Figure 30:
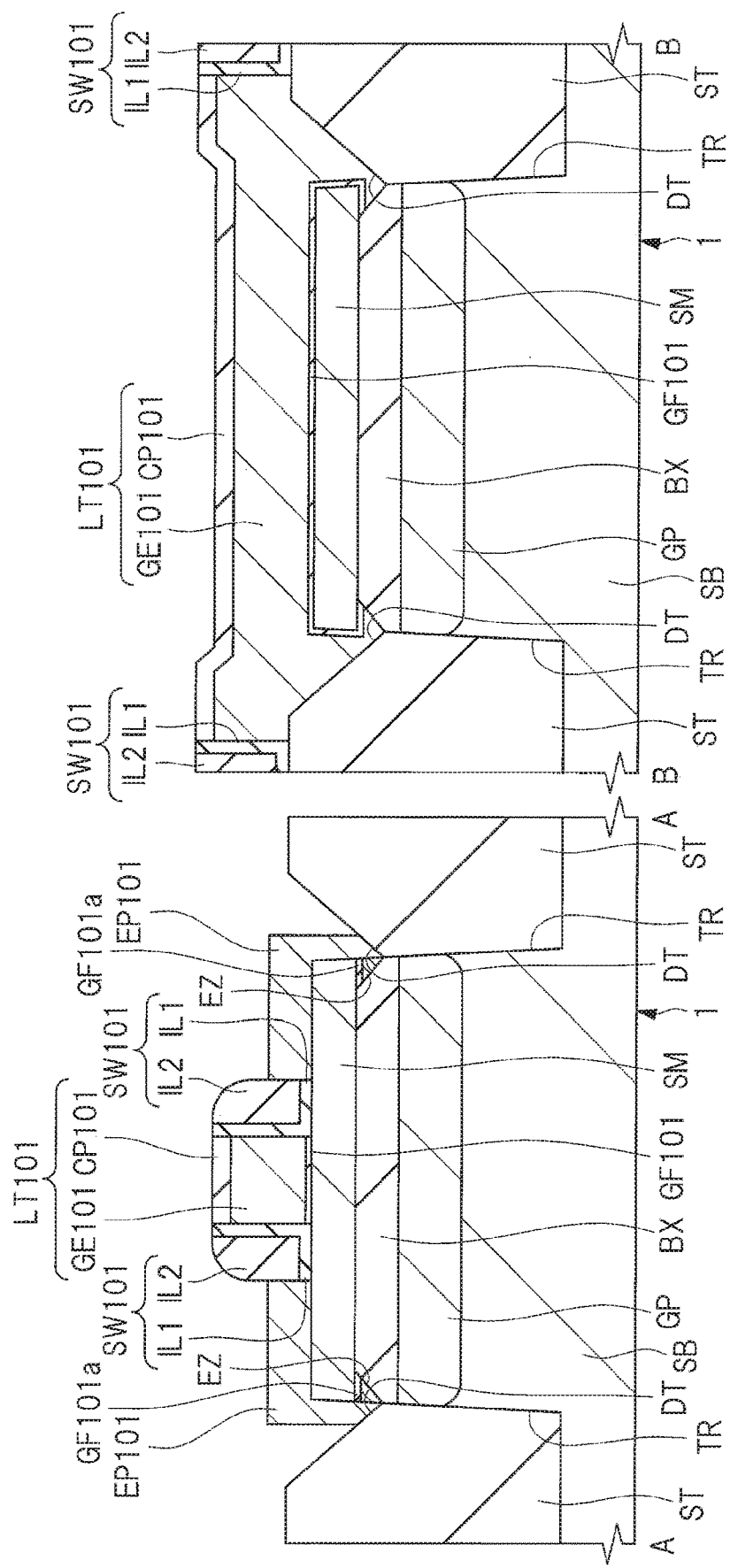
FIG. 30 is a cross-sectional view showing a principal part of the semiconductor device in the manufacturing process subsequent to FIG. 29.
Figure 31:
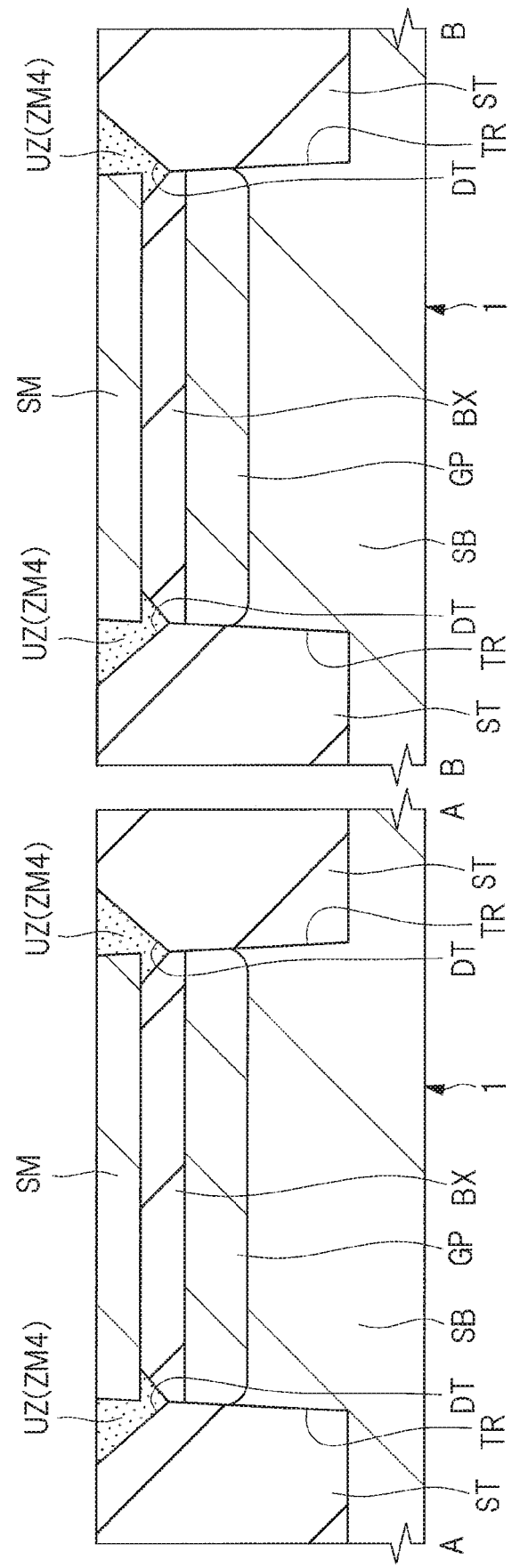
FIG. 31 is a cross-sectional view showing a principal part of a semiconductor device in a manufacturing process according to another embodiment.

Next, as shown in FIG. 30, a semiconductor layer EP101 for source and drain is formed by the epitaxial growth on the semiconductor layer SM of the SOI substrate 1.

Since the semiconductor layer EP101 is formed by the epitaxial growth, the epitaxial layer (semiconductor layer EP101) is selectively grown on the exposed surface (Si surface) of the semiconductor layer SM, and the epitaxial layer is not grown on the insulating film. Therefore, the semiconductor layer EP101 is selectively grown on the surface (exposed surface) of the semiconductor layer SM in the region which is not covered with the stacked body LT101 and the sidewall spacer SW101.

The subsequent process in the study example is the same as that of the present embodiment, and thus the illustration and description thereof are omitted here.

Since the buried insulating film UZ is not formed in the study example, there is a fear that the etching residue (residual part EZ) of the silicon film PS101 is left in the divot DT when the silicon film PS101 is patterned to form the gate electrode GE101 (see FIG. 28).

The divot DT is formed by excessively etching the element isolation region ST in the etching process of the insulating film ZM1 or the subsequent etching process. When the silicon film PS101 that is formed in the state where the divot DT is formed but the buried insulating film UZ is not formed is patterned, the residual part (etching residue) EZ of the silicon film PS101 is formed in the divot DT.

There is a fear that various problems occur when the residual part EZ of the silicon film PS101 is left in the divot DT, and the residual part EZ is thus undesirable in terms of the reliability of the semiconductor device. Examples of the problems caused by the presence of the residual part EZ of the silicon film PS101 formed in the divot DT will be described below.

When the divot DT of the element isolation region ST is formed at the position adjacent to the semiconductor layer SM in the etching process of the insulating film ZM1 or the subsequent etching process and the divot DT reaches the insulating layer BX as shown in FIG. 8, the insulating layer BX exposed from the divot DT is side-etched. In this case, a part of the lower surface of the semiconductor layer SM is exposed from the divot DT. Namely, the insulating layer BX is side-etched in the divot DT and is hollowed out in the lateral direction, and a part of the lower surface of the semiconductor layer SM is exposed from the hollow part. When the silicon film PS101 is formed and is then patterned to form the gate electrode GE101 in such a state where the divot DT is formed, the residual part EZ corresponding to the etching residue of the silicon film PS101 is left in the divot DT. Since a part of the silicon film PS101 located below the semiconductor layer SM is hard to be etched in the etching process for patterning the silicon film PS101 because it is shielded by the semiconductor layer SM, the residual part EZ of the silicon film PS101 is left below the semiconductor layer SM (see FIG. 28).

When the residual part EZ of the silicon film PS101 is left in the divot DT, the residual part EZ is adjacent to the semiconductor layer SM via a thin insulating film GF101a, and is thus adjacent to the semiconductor regions for source and drain (corresponding to $n^+$ type semiconductor regions SD described above) via the thin insulating film GF101a.

The thin insulating film 101a interposed between the residual part EZ in the divot DT and the semiconductor layer SM is a part of the gate insulating film GF101 left between the residual part EZ and the semiconductor layer SM. Also, since both end parts of the gate electrode GE101 in the gate width direction are located on the element isolation region ST, the residual part EZ in the divot DT is integrally connected with the gate electrode GE101, and thus, the residual part EZ in the divot DT is electrically connected to the gate electrode GE101. Consequently, when the residual part EZ of the silicon film PS101 is left in the divot DT, the residual part EZ electrically connected to the gate electrode GE101 is adjacent to the source/drain regions (corresponding to the n$^+$ type semiconductor regions SD) via the thin insulating film GF101a, and thus there is a fear that the leakage current is generated between the gate electrode GE101 and the source/drain regions (n$^+$ type semiconductor regions SD), and this causes the decrease in the reliability of the semiconductor device.

In addition, there is also a fear that the epitaxial layer (semiconductor layer EP101) grown from the side surface of the semiconductor layer SM is in contact with the residual part EZ as shown in FIG. 30 when the semiconductor layer EP101 is epitaxially grown. When the semiconductor layer EP101 is in contact with the residual part EZ, the semiconductor layer EP101 and the gate electrode GE101 are electrically connected via the residual part EZ, and thus the leakage current is generated between the gate electrode GE101 and the source/drain regions (n$^+$ type semiconductor regions SD), and this causes the decrease in the reliability of the semiconductor device.

As described above, the residual part (EZ) which is formed in the patterning of the conductive film for forming the gate electrode and is left in the divot DT of the element isolation region ST leads to the decrease in the reliability of the semiconductor device and thus needs to be prevented.

<Main Characteristics of Present Embodiment>

One of main characteristics of the present embodiment is to form the buried insulating film UZ.

Namely, the divot DT (hollow part) is formed in the element isolation region ST at the position adjacent to the semiconductor layer SM in a certain wet etching process before the gate insulating film GF is formed. There is a high possibility that the divot DT is formed in the etching process of the insulating film ZM1, and even when the divot DT is not formed in the etching process of the insulating film ZM1, the divot DT is formed in the subsequent various wet etching processes before the process of forming the gate insulating film GF. Accordingly, in the present embodiment, the process of forming the gate insulating film GF and the process of forming the gate electrode GE are performed after the buried insulating film UZ is formed in the divot DT. Namely, the process of forming the gate insulating film GF is performed in the state where the buried insulating film UZ has been formed in the divot DT (hollow part) formed in the element isolation region ST at the position adjacent to the semiconductor layer SM. In other words, although the divot DT is formed in the element isolation region ST at the position adjacent to the semiconductor layer SM before the process of forming the gate insulating film GF is performed, the process of forming the gate insulating film GF and the process of forming the gate electrode GE are performed after the buried insulating film UZ is formed in the divot DT.

In addition, in the manufactured semiconductor device, the divot DT (hollow part) is formed in the element isolation region ST at the position adjacent to the semiconductor layer SM and the buried insulating film UZ is formed in the divot DT, and the gate electrode GE includes a part located on the buried insulating film UZ. Note that the fact that the gate electrode GE includes a part located on the buried insulating film UZ indicates that the gate electrode GE is formed after the buried insulating film UZ is formed.

When the divot DT is formed in the element isolation region ST at the position adjacent to the semiconductor layer SM and the gate electrode is formed without forming the buried insulating film UZ in the divot DT unlike the present embodiment (corresponding to study example described above), there is a fear that the etching residue (corresponding to residual part EZ described above) of the conductive film (corresponding to silicon film PS, PS101 described above) for forming the gate electrode is left in the divot DT, and this causes the decrease in the reliability of the semiconductor device.

Meanwhile, in the present embodiment, the divot DT is formed in the element isolation region ST at the position adjacent to the semiconductor layer SM, but the gate electrode GE is formed after the buried insulating film UZ is formed in the divot DT. Since the process of forming the gate electrode GE is performed in the state where the buried insulating film UZ has been formed in the divot DT, it is possible to prevent the etching residue of the conductive film (silicon film PS in this case) for forming the gate electrode from being left in the divot DT. Therefore, it is possible to improve the reliability of the semiconductor device.

Namely, the gate electrode GE is formed by patterning the conductive film (silicon film PS in this case) for forming the gate electrode GE. At this time, the presence of the buried insulating film UZ in the divot DT prevents the conductive film (silicon film PS) for forming the gate electrode from being buried in the divot DT, and prevents the etching residue of the conductive film (silicon film PS) from being left in the divot DT after the patterning of the conductive film (silicon film PS). Accordingly, it is possible to prevent various problems caused by the etching residue of the conductive film (silicon film PS) left in the divot DT, and it is possible to improve the reliability of the semiconductor device.

It is effective to form the gate electrode GE after the buried insulating film UZ is formed in the divot DT for preventing the etching residue (corresponding to residual part EZ described above) of the conductive film for forming the gate electrode from being left in the divot DT. More specifically, it is effective to form the conductive film (silicon film PS in this case) for forming the gate electrode GE after the buried insulating film UZ is formed in the divot DT.

However, it is preferable that the process of forming the gate insulating film GF is also performed after the buried insulating film UZ is formed. When the buried insulating film UZ is formed after the gate insulating film GF is formed, there is a fear that the gate insulating film GF is affected by the process of forming the buried insulating film UZ. For example, when the buried insulating film UZ is formed after the gate insulating film GF is formed, there is a fear that the gate insulating film GF is removed or is at least damaged if not removed in the etch-back process of the insulating film ZM4. Meanwhile, since the gate insulating film GF is formed after the buried insulating film UZ is formed in the present embodiment, it is possible to prevent the gate insulating film GF from being affected by the process of forming the buried insulating film UZ. For example, since the etch-back process of the insulating film ZM4 is performed in the state where the gate insulating film GF is not formed yet, the gate insulating film GF is prevented from being adversely affected by the etch-back process of the insulating film ZM4. In the case of the second embodiment described below, since the polishing process of the insulating film ZM4 is performed in the state where the gate insulating film GF is not formed yet, the gate insulating film GF is prevented from being adversely affected by the polishing process of the insulating film ZM4. Therefore, it is preferable that not only the process of forming the gate electrode GE but also the process of forming the gate insulating film GF is performed after the buried insulating film UZ is formed.

In addition, as described in the study example, when the etching residue (corresponding to residual part EZ described above) of the conductive film for forming the gate electrode is left in the divot DT, there is a fear that the semiconductor layer for source and drain (corresponding to semiconductor layer EP, EP101) epitaxially grown on the semiconductor layer SM is in contact with the residual part EZ, and this causes the leakage between the gate electrode and the source/drain regions. Therefore, when the semiconductor layer for source and drain (semiconductor layer EP in this case) is formed on the semiconductor layer SM by the epitaxial growth, it is very important to prevent the etching residue of the conductive film for forming the gate electrode from being left in the divot DT in terms of the improvement of the reliability of the semiconductor device. Accordingly, the effect is extremely large if the present embodiment or the second embodiment described below is applied to the case where the semiconductor layer for source and drain (semiconductor layer EP in this case) is formed on the semiconductor layer SM by the epitaxial growth.

Further, in the present embodiment, the height position of the upper surface of the buried insulating film UZ is equal to the height position of the upper surface of the semiconductor layer SM, is equal to the height position of the lower surface of the semiconductor layer SM, or is lower than the height position of the upper surface of the semiconductor layer SM and higher than the height position of the lower surface of the semiconductor layer SM.

When the height position of the upper surface of the buried insulating film UZ is higher than the height position of the upper surface of the semiconductor layer SM unlike the present embodiment, the insulating film ZM4 used for forming the buried insulating film UZ is left on the upper surface of the semiconductor layer Sm after the buried insulating film UZ is formed, and it becomes difficult to form the gate insulating film GF and the gate electrode GE. Meanwhile, since the height position of the upper surface of the buried insulating film UZ is equal to or lower than the height position of the upper surface of the semiconductor layer SM in the present embodiment, the insulating film ZM4 used for forming the buried insulating film UZ is less likely to be left on the upper surface of the semiconductor layer SM after the buried insulating film UZ is formed, and the formation of the gate insulating film GF and the gate electrode GE can be facilitated.

Also, when the height position of the upper surface of the buried insulating film UZ is lower than the height position of the lower surface of the semiconductor layer SM unlike the present embodiment, there is a possibility that the etching residue (corresponding to residual part EZ described above) of the conductive film for forming the gate electrode is left in the divot DT even when the buried insulating film UZ is formed. Here, the case where the height position of the upper surface of the buried insulating film UZ is lower than the height position of the lower surface of the semiconductor layer SM is assumed. In this case, there is a possibility that a space is formed between the lower surface of the semiconductor layer SM and the upper surface of the buried insulating film UZ, and the conductive film (corresponding to silicon film PS, PS101 described above) for forming the gate electrode is buried in the space and is left even after the gate electrode is formed. Meanwhile, since the height position of the upper surface of the buried insulating film UZ is higher than the height position of the lower surface of the semiconductor layer SM in the present embodiment, no space is formed between the lower surface of the semiconductor layer SM and the upper surface of the buried insulating film UZ when the buried insulating film UZ is formed, and it is thus possible to prevent the phenomenon that the conductive film for forming the gate electrode is buried in the space between the lower surface of the semiconductor layer SM and the upper surface of the buried insulating film UZ. Accordingly, it is possible to more reliably prevent the etching residue of the conductive film for forming the gate electrode from being left in the divot DT by forming the buried insulating film UZ so that the height position of the upper surface of the buried insulating film UZ is higher than the height position of the lower surface of the semiconductor layer SM.

Consequently, it is preferable that the height position of the upper surface of the buried insulating film UZ is equal to the height position of the upper surface of the semiconductor layer SM, is equal to the height position of the lower surface of the semiconductor layer SM, or is lower than the height position of the upper surface of the semiconductor layer SM and higher than the height position of the lower surface of the semiconductor layer SM. In this manner, the formation of the gate insulating film GF and the gate electrode GE can be facilitated, and it is possible to more reliably prevent the etching residue of the conductive film (silicon film PS in this case) for forming the gate electrode from being left in the divot DT.

In addition, at least a part of the buried insulating film UZ is located below the semiconductor layer SM in the present embodiment. The fact that at least a part of the buried insulating film UZ is located below the semiconductor layer SM indicates that there is a high possibility that the etching residue of the conductive film (silicon film PS in this case) for forming the gate electrode is left below the semiconductor layer SM if the buried insulating film UZ is not formed in the divot DT.

Namely, the fact that at least a part of the buried insulating film UZ is located below the semiconductor layer SM indicates that the insulating layer BX exposed from the divot DT is side-etched when the divot DT is formed and a part of the lower surface of the semiconductor layer SM is exposed from the divot DT (see FIG. 8). When the gate insulating film GF101 is formed in this state without forming the buried insulating film UZ and then the silicon film PS101 is formed and patterned to form the gate electrode GE101 like in the study example, the etching residue (residual part EZ) of the silicon film PS101 is likely to be formed below the semiconductor layer SM as shown in FIG. 28. This is because a part of the silicon film PS101 located below the semiconductor layer SM is shielded by the semiconductor layer SM and is thus hard to be etched in the etching process for patterning the silicon film PS101 and the residual part EZ of the silicon film PS101 is left below the semiconductor layer SM.

Meanwhile, in the present embodiment, even when the insulating layer BX is side-etched when the divot DT is formed and a part of the lower surface of the semiconductor layer SM is exposed from the divot DT, it is possible to prevent the etching residue of the conductive film (silicon film PS in this case) for forming the gate electrode from being left below the semiconductor layer SM by forming the buried insulating film UZ in the divot DT. Accordingly, the effect is extremely large if the present embodiment or the second embodiment described below is applied to the case where the insulating layer BX is side-etched when the divot DT is formed and a part of the lower surface of the semiconductor layer SM is exposed from the divot DT. Namely, when at least a part of the buried insulating film UZ is located below the semiconductor layer SM in the present embodiment or the second embodiment described below, the effect obtained by forming the buried insulating film UZ, specifically, the effect obtained by preventing the etching residue of the conductive film for forming the gate electrode is extremely large.

Second Embodiment

A manufacturing process of a semiconductor device according to the second embodiment will be described with reference to drawings. FIG. 31 to FIG. 35 are cross-sectional views each showing a principal part of the semiconductor device in the manufacturing process according to the second embodiment. Like the first embodiment described above, in each of FIG. 31 to FIG. 35 of the second embodiment, a cross-sectional view of a cross section A-A is shown on a left side, and a cross-sectional view of a cross section B-B is shown on a right side. Note that the cross-sectional view at the position corresponding to a line A-A in the plan views of FIG. 11 and FIG. 15 corresponds to the cross-sectional view A-A, and the cross-sectional view at the position corresponding to a line B-B in the plan views of FIG. 11 and FIG. 15 corresponds to the cross-sectional view B-B.

The second embodiment is different from the above-described first embodiment in the method of forming the buried insulating film UZ. Namely, the buried insulating film UZ is formed by etching back the insulating film ZM4 for the buried insulating film UZ in the first embodiment, while the buried insulating film UZ is formed by the polishing process (CMP process) of the insulating film ZM4 for the buried insulating film UZ in the second embodiment. Hereinafter, the manufacturing process according to the second embodiment will be described in detail with reference to FIG. 31 to FIG. 35.

The process up to forming the insulating film ZM4 to obtain the structure shown in FIG. 9 is almost the same in both the manufacturing process according to the second embodiment and the manufacturing process according to the first embodiment, and thus the repetitive description thereof is omitted here.

After the insulating film ZM4 is formed to obtain the structure shown in FIG. 9, the insulating film ZM4 is polished in the second embodiment. This polishing is referred to as a polishing process of the insulating film ZM4. The CMP process can be suitably used for the polishing process of the insulating film ZM4. By performing the polishing process of the insulating film ZM4, the insulating film ZM4 outside the divot DT is removed and a part of the insulating film ZM4 is left in the divot DT. In this manner, the upper surface of the semiconductor layer SM is exposed, and the buried insulating film UZ is formed in the divot DT. The buried insulating film UZ is made of the insulating film ZM4 left inside the divot DT. Note that the plan view at the stage where the polishing process of the insulating film ZM4 is finished is almost the same as FIG. 11, and thus the repetitive illustration thereof is omitted.

As described in the first embodiment, the divot DT is formed at the position (region) adjacent to the semiconductor layer SM in plan view, and thus the buried insulating film UZ which fills the divot DT is also formed at the position (region) adjacent to the semiconductor layer SM in plan view. Namely, since the divot DT is formed so as to surround the semiconductor layer SM in plan view, the buried insulating film UZ which fills the divot DT is also formed so as to surround the semiconductor layer SM in plan view (see FIG. 11). This is common to both the second embodiment and the first embodiment.

The buried insulating film UZ is formed so as to fill the divot DT, and the height position of the upper surface of the buried insulating film UZ is almost equal to the height position of the upper surface of the semiconductor layer SM in the second embodiment. This is because the polishing process of the insulating film ZM4 needs to be performed until the insulating film ZM4 on the semiconductor layer SM is removed and the upper surface of the semiconductor layer SM is exposed. When the upper surface of the semiconductor layer SM has been exposed by removing the insulating film ZM4 on the semiconductor layer SM in the polishing process of the insulating film ZM4, the height position of the upper surface of the buried insulating film UZ thus formed is almost equal to the height position of the upper surface of the semiconductor layer SM. Namely, the upper surface of the semiconductor layer SM and the upper surface of the buried insulating film UZ are located on the same plane. In the polishing process of the insulating film ZM4, the polishing process is performed under the condition that the semiconductor layer SM is hard to be polished compared with the insulating film ZM4, and the semiconductor layer SM can be used as a polishing stopper film.

Further, in the polishing process of the insulating film ZM4, not only the insulating film ZM4 but also a part (upper part) of the element isolation region ST may be polished and removed in some cases. Namely, a part of the element isolation region ST located at a position higher than the upper surface of the semiconductor layer SM may be polished and removed by the polishing process of the insulating film ZM4.

Accordingly, when the polishing process of the insulating film ZM4 is finished, the height position of the upper surface of the buried insulating film UZ is almost equal to the height position of the upper surface of the semiconductor layer SM, and the height position of the upper surface of the element isolation region ST may also be almost equal to the height position of the upper surface of the semiconductor layer SM and the height position of the upper surface of the buried insulating film UZ. In this case, the upper surface of the semiconductor layer SM, the upper surface of the buried insulating film UZ and the upper surface of the element isolation region ST are located on the same plane.

In this manner, the structure in which the buried insulating film UZ is buried in the divot DT is obtained.

Figure 32:
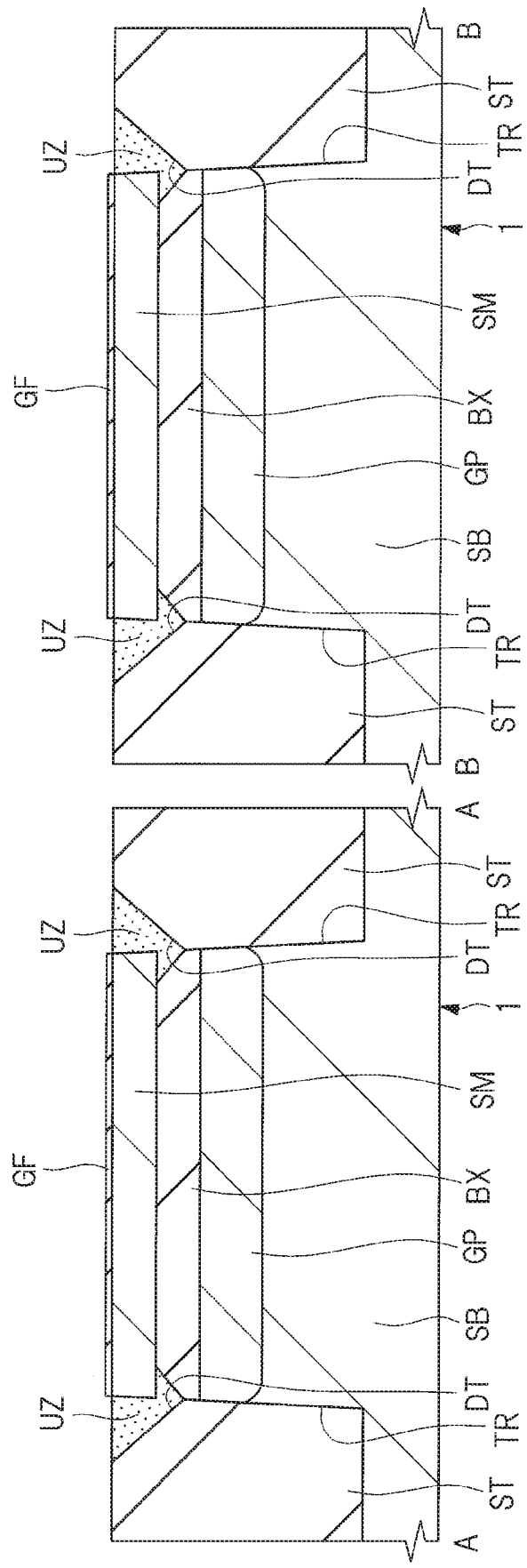
FIG. 32 is a cross-sectional view showing a principal part of the semiconductor device in the manufacturing process subsequent to FIG. 31.

The subsequent process in the second embodiment is basically the same as that of the first embodiment described above. Namely, after the surface of the semiconductor layer SM is cleaned by performing the cleaning process (wet etching process for cleaning) as needed, the gate insulating film GF is formed on the surface of the semiconductor layer SM as shown in FIG. 32. The method and material used to form the gate insulating film GF in the second embodiment are the same as those of the first embodiment.

Note that since the buried insulating film UZ is formed by the polishing process of the insulating film ZM4 in the second embodiment and the side surface of the semiconductor layer SM is thus covered with the buried insulating film UZ and is not exposed, the gate insulating film GF is formed on the upper surface of the semiconductor layer SM, but is not formed on the side surface of the semiconductor layer SM.

Figure 33:
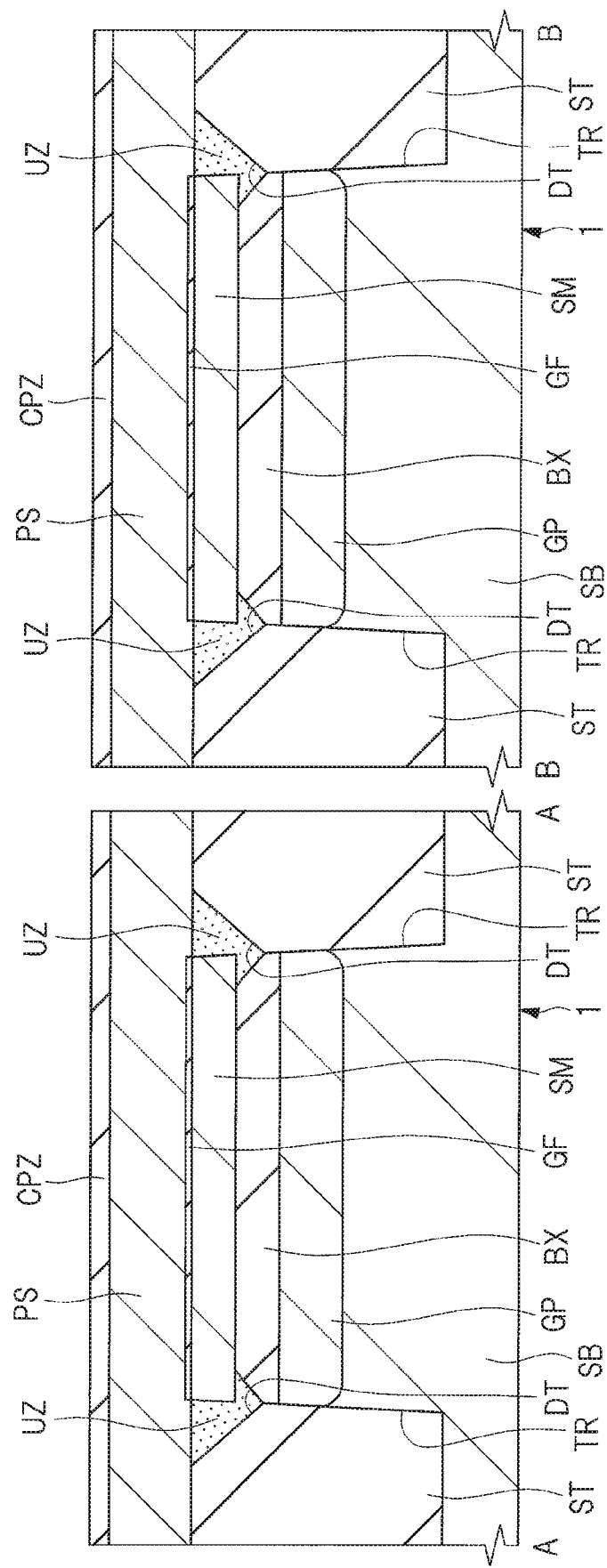
FIG. 33 is a cross-sectional view showing a principal part of the semiconductor device in the manufacturing process subsequent to FIG. 32.

Next, as shown in FIG. 33, the silicon film PS is formed as the conductive film for forming the gate electrode over the main surface of the SOI substrate 1, that is, on the gate insulating film GF, the buried insulating film UZ and the element isolation region ST, and then the insulating film CPZ is formed on the silicon film PS.

Figure 34:
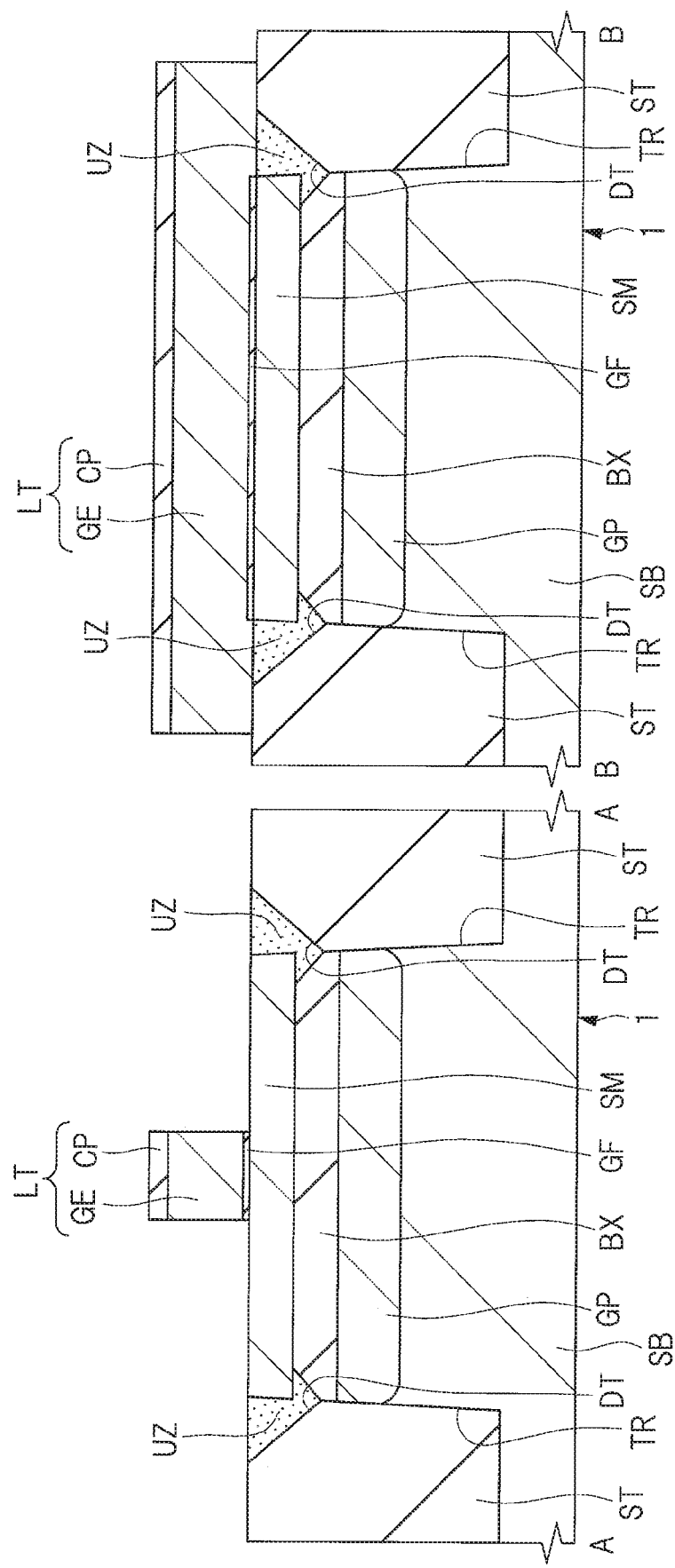
FIG. 34 is a cross-sectional view showing a principal part of the semiconductor device in the manufacturing process subsequent to FIG. 33.

Next, as shown in FIG. 34, the insulating film CPZ is patterned by the photolithography technique and the dry etching technique, and then the silicon film PS is patterned by the dry etching using the patterned insulating film CPZ as an etching mask, thereby forming the stacked body LT composed of the gate electrode GE and the cap insulating film CP formed thereon. The gate electrode GE is formed of the patterned silicon film PS, and the cap insulating film CP is formed of the patterned insulating film CPZ. The gate electrode GE (stacked body LT) is formed on the semiconductor layer SM via the gate insulating film GF. A part of the gate insulating film GF which is not covered with the gate electrode GE can be removed by, for example, the dry etching for patterning the silicon film PS or the subsequent wet etching.

Also in the second embodiment, both end parts of the gate electrode GE in the gate width direction are located on the element isolation region ST, and a part of the gate electrode GE is located on the buried insulating film UZ like in the first embodiment described above. Namely, the gate electrode GE includes the part formed on the semiconductor layer SM via the gate insulating film GF, the part located on the buried insulating film UZ, and the part located on the element isolation region ST.

Figure 35:
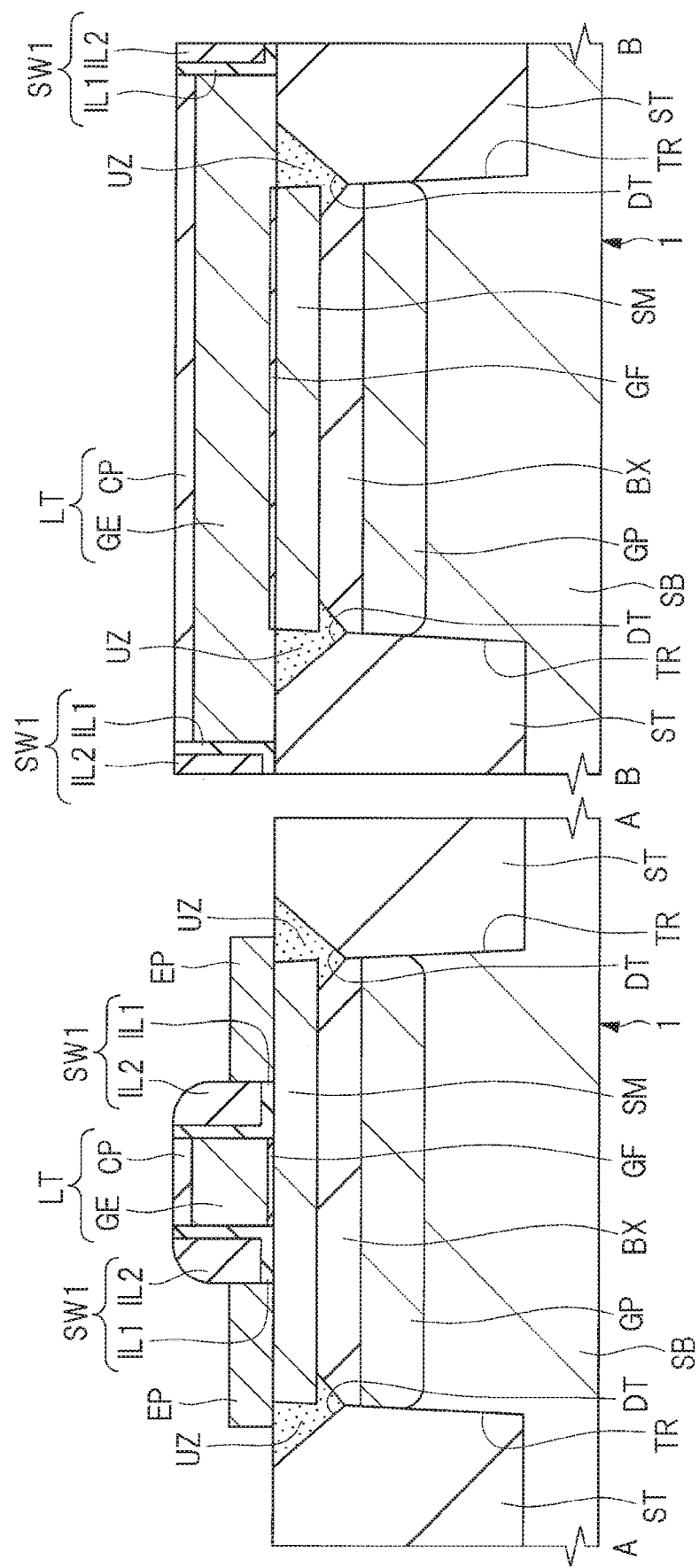
FIG. 35 is a cross-sectional view showing a principal part of the semiconductor device in the manufacturing process subsequent to FIG. 34.

Next, as shown in FIG. 35, the sidewall spacer SW1 is formed on the side surface of the stacked body LT like in the first embodiment described above. The structure and formation method of the sidewall spacer SW1 in the second embodiment are the same as those of the first embodiment described above, and thus the description thereof is omitted here.

Next, as shown in FIG. 35, the semiconductor layer EP is formed on the semiconductor layer SM of the SOI substrate 1 by the epitaxial growth. As described in the first embodiment, the semiconductor layer EP is a semiconductor layer (epitaxial semiconductor layer) for source and drain (for forming source and drain). The configuration, formation method and formation position of the semiconductor layer EP in the second embodiment are almost the same as those of the first embodiment described above.

However, since the buried insulating film UZ is formed by the polishing process of the insulating film ZM4 in the second embodiment and the side surface of the semiconductor layer SM is thus covered with the buried insulating film UZ and is not exposed, the epitaxial layer (semiconductor layer EP) is not grown from the side surface of the semiconductor layer SM.

The subsequent process in the second embodiment is the same as that of the first embodiment described above, and the process described with reference to FIG. 18 to FIG. 24 is performed, but the repetitive illustration and description thereof are omitted here.

The major difference in configuration (structure) between the semiconductor device according to the second embodiment and the semiconductor device according to the first embodiment will be described below.

In reflection of the fact that the buried insulating film UZ is formed by the polishing process of the insulating film ZM4, the height position of the upper surface of the buried insulating film UZ is almost equal to the height position of the upper surface of the semiconductor layer SM in the second embodiment. Namely, the upper surface of the semiconductor layer SM and the upper surface of the buried insulating film UZ are located on the same plane.

Also, in reflection of the fact that the buried insulating film UZ is formed by the polishing process of the insulating film ZM4, the height position of the upper surface of the element isolation region ST is almost equal to the height position of the upper surface of the semiconductor layer SM and the height position of the upper surface of the buried insulating film UZ in some cases. Namely, the upper surface of the semiconductor layer SM, the upper surface of the buried insulating film UZ and the upper surface of the element isolation region ST are located on the same plane in some cases.

Since the other configuration of the semiconductor device according to the second embodiment is almost the same as that of the semiconductor device according to the first embodiment described above, the repetitive description thereof is omitted here.

Next, the effect of the second embodiment will be described.

Also in the second embodiment, substantially the same effect as that of the first embodiment described above can be obtained. To put it simply, it is possible to prevent the etching residue of the conductive film (silicon film PS in this case) for forming the gate electrode from being left in the divot DT by forming the buried insulating film UZ, and it is possible to improve the reliability of the semiconductor device.

In addition, since the buried insulating film UZ is formed by the polishing process of the insulating film ZM4 in the case of the second embodiment, the following effect can also be obtained.

That is, since the buried insulating film UZ is formed by the polishing process of the insulating film ZM4 in the second embodiment, the height position of the upper surface of the buried insulating film UZ can be easily controlled, and the height position of the upper surface of the buried insulating film UZ is almost equal to the height position of the upper surface of the semiconductor layer SM by performing the polishing process of the insulating film ZM4 until the upper surface of the semiconductor layer SM is exposed. As described in the first embodiment, if the height position of the upper surface of the buried insulating film UZ is lower than the height position of the lower surface of the semiconductor layer SM, a space is formed between the lower surface of the semiconductor layer SM and the upper surface of the buried insulating film UZ, so that the silicon film PS is buried in the space and is left even after the gate electrode is formed in some cases. In the second embodiment, however, the buried insulating film UZ is formed by the polishing process of the insulating film ZM4, and thus the height position of the upper surface of the buried insulating film UZ can be controlled easily and the height position of the upper surface of the buried insulating film UZ is almost equal to the height position of the upper surface of the semiconductor layer SM. Therefore, it is possible to more reliably prevent the height position of the upper surface of the buried insulating film UZ from being lower than the height position of the lower surface of the semiconductor layer SM. Accordingly, the management of the formation process of the buried insulating film UZ is easier in the second embodiment than the first embodiment, and the manufacture of the semiconductor device is facilitated in the second embodiment compared with the first embodiment.

Also, a silicon oxide film or a silicon nitride film can be suitably used as the insulating film ZM4 in the second embodiment.

However, when a silicon oxide film is used as the insulating film ZM4, the insulating film ZM4 and the element isolation region ST are made of the same material (silicon oxide), and thus the polishing rate of the insulating film ZM4 and the polishing rate of the element isolation region ST are almost equal to each other in the polishing process of the insulating film ZM4. Accordingly, when a silicon oxide film is used as the insulating film ZM4 in the second embodiment, the height position of the upper surface of the element isolation region ST can be easily made almost equal to the height position of the upper surface of the buried insulating film UZ, and a height difference is less likely to occur between (at the boundary of) the element isolation region ST and the buried insulating film UZ. Consequently, it is easy to prevent the problem caused when the height difference occurs between (at the boundary of) the element isolation region ST and the buried insulating film UZ.

In addition, when a silicon nitride film is used as the insulating film ZM4 in the second embodiment, it is easy to suppress or prevent the buried insulating film UZ from being etched in the cleaning process (hydrofluoric acid cleaning or RCA cleaning) before forming the gate insulating film.

In the foregoing, the invention made by the inventor of the present invention has been concretely described based on the embodiments. However, it is needless to say that the present invention is not limited to the foregoing embodiments and various modifications and alterations can be made within the scope of the present invention.

What is claimed is:

1. A manufacturing method of a semiconductor device, comprising the steps of:
   (a) preparing a substrate having a semiconductor substrate, an insulating layer on the semiconductor substrate, a semiconductor layer on the insulating layer, a first insulating film on the semiconductor layer, a trench penetrating the first insulating film, the semiconductor layer and the insulating layer to reach the semiconductor substrate, and an element isolation region buried in the trench;
   (b) after the step (a), removing the first insulating film by etching, thereby exposing the semiconductor layer;
   (c) after the step (b), forming a gate insulating film on a surface of the semiconductor layer; and
   (d) after the step (c), forming a gate electrode on the semiconductor layer via the gate insulating film,
   wherein the step (c) is performed in a state where a hollow part is formed in the element isolation region at a position adjacent to the semiconductor layer and a buried insulating film is formed inside the hollow part,
   the manufacturing method further comprising, after the step (b) and before the step (c), the steps of:
   (c1) forming a second insulating film for forming the buried insulating film on the element isolation region and the semiconductor layer including the inside of the hollow part; and
   (c2) removing the second insulating film outside the hollow part so as to leave the second insulating film in the hollow part, thereby forming the buried insulating film extended from the element isolation region to the insulating layer.

2. The manufacturing method of a semiconductor device according to claim 1,
   wherein the hollow part is formed in the step (b) or after the step (b) and before the step (c1).

3. The manufacturing method of a semiconductor device according to claim 1,
   wherein a part of the buried insulating film is located below the semiconductor layer.

4. The manufacturing method of a semiconductor device according to claim 1,
   wherein, in the step (c2), the second insulating film is etched back so as to remove the second insulating film outside the hollow part and leave the second insulating film in the hollow part, thereby forming the buried insulating film.

5. The manufacturing method of a semiconductor device according to claim 4,
   wherein a height position of an upper surface of the buried insulating film formed in the step (c2) is equal to a height position of an upper surface of the semiconductor layer, equal to a height position of a lower surface of the semiconductor layer, or lower than the height position of the upper surface of the semiconductor layer and higher than the height position of the lower surface of the semiconductor layer.

6. The manufacturing method of a semiconductor device according to claim 1,
   wherein, in the step (c2), the second insulating film is polished so as to remove the second insulating film outside the hollow part and leave the second insulating film in the hollow part, thereby forming the buried insulating film.

7. The manufacturing method of a semiconductor device according to claim 6,
   wherein a height position of an upper surface of the buried insulating film formed in the step (c2) is equal to a height position of an upper surface of the semiconductor layer.

8. The manufacturing method of a semiconductor device according to claim 1,
   wherein the step (d) includes the steps of:
   (d1) forming a conductive film for forming the gate electrode on the semiconductor layer, the buried insulating film and the element isolation region; and
   (d2) forming the gate electrode by pattering the conductive film.

9. The manufacturing method of a semiconductor device according to claim 8,
   wherein the gate electrode includes a part formed on the semiconductor layer via the gate insulating film, a part located on the buried insulating film and a part located on the element isolation region.

10. The manufacturing method of a semiconductor device according to claim 1, further comprising the steps of:
    (e) after the step (d), forming a sidewall insulating film on a sidewall of the gate electrode; and
    (f) after the step (e), epitaxially growing an epitaxial semiconductor layer on the semiconductor layer exposed without being covered with the gate electrode and the sidewall insulating film.

11. The manufacturing method of a semiconductor device according to claim 1,
    wherein the insulating layer, the first insulating film and the element isolation region are made of silicon oxide.

12. The manufacturing method of a semiconductor device according to claim 1, wherein the buried insulating film is made of silicon nitride or silicon oxide.

13. The manufacturing method of a semiconductor device according to claim 1, further comprising, after the step (a) and before the step (b), the step of:
(b1) forming a first semiconductor region by ion-implanting an impurity into the semiconductor substrate.

14. The manufacturing method of a semiconductor device according to claim 13,
wherein, in the step (b1), the impurity is implanted also into a part of the element isolation region adjacent to the semiconductor layer in plan view.

15. The manufacturing method of a semiconductor device according to claim 1,
wherein the step (a) includes the steps of:
(a1) preparing the substrate having the semiconductor substrate, the insulating layer on the semiconductor substrate, the semiconductor layer on the insulating layer, the first insulating film on the semiconductor layer, and a third insulating film on the first insulating film;
(a2) after the step (a1), forming a trench penetrating the third insulating film, the first insulating film, the semiconductor layer and the insulating layer to reach the semiconductor substrate;
(a3) after the step (a2), forming a fourth insulating film on the third insulating film so as to fill the trench;
(a4) after the step (a3), removing the fourth insulating film outside the trench, thereby forming the element isolation region made of the fourth insulating film in the trench; and
(a5) after the step (a4), removing the third insulating film by etching,
wherein the insulating layer, the first insulating film and the fourth insulating film are made of silicon oxide, and
wherein the third insulating film is made of silicon nitride.

16. The manufacturing method according to claim 1,
wherein, in a direction from the insulating layer to the semiconductor layer:
a height of the buried insulating film is less than or equal to a height of the semiconductor layer, and
the height of the semiconductor layer is less than a height of the element isolation region,
wherein the gate insulating film contacts the buried insulating film, and
wherein, in plan view, the buried insulating film surrounds the semiconductor layer.

* * * * *